(12) United States Patent
Shimada et al.

(10) Patent No.: US 11,171,278 B2
(45) Date of Patent: Nov. 9, 2021

(54) THERMOELECTRIC CONVERSION MATERIAL, THERMOELECTRIC CONVERSION MODULE, AND METHOD FOR MANUFACTURING THERMOELECTRIC CONVERSION MATERIAL

(71) Applicant: HITACHI METALS, LTD., Tokyo (JP)

(72) Inventors: Takeshi Shimada, Tokyo (JP); Nan Wang, Tokyo (JP); Michiko Matsuda, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 16/962,461

(22) PCT Filed: Jan. 15, 2019

(86) PCT No.: PCT/JP2019/000945
§ 371 (c)(1),
(2) Date: Jul. 15, 2020

(87) PCT Pub. No.: WO2019/139168
PCT Pub. Date: Jul. 18, 2019

(65) Prior Publication Data
US 2021/0074898 A1 Mar. 11, 2021

(30) Foreign Application Priority Data
Jan. 15, 2018 (JP) .............................. JP2018-004538

(51) Int. Cl.
*H01L 35/18* (2006.01)
*B22F 3/10* (2006.01)
(Continued)

(52) U.S. Cl.
CPC ............ *H01L 35/18* (2013.01); *B22F 3/1007* (2013.01); *B22F 9/04* (2013.01); *C01G 51/006* (2013.01);
(Continued)

(58) Field of Classification Search
None
See application file for complete search history.

(56) References Cited

U.S. PATENT DOCUMENTS

| 2006/0118156 A1 | 6/2006 | Nakajima |
| 2013/0043439 A1 | 2/2013 | Chen et al. |
| 2017/0279025 A1* | 9/2017 | Haraguchi ............. H01L 35/22 |

FOREIGN PATENT DOCUMENTS

| JP | 2001-135865 A | 5/2001 |
| JP | 2001-185767 A | 7/2001 |

(Continued)

OTHER PUBLICATIONS

Ding, "Creation of Yb2O3 Nanoprecipitates Through an Oxidation Process in Bulk Yb-Filled Skutterudites", Journal of Electronic Materials, vol. 42, No. 3, 2013 (Year: 2013).*

(Continued)

*Primary Examiner* — Devina Pillay
(74) *Attorney, Agent, or Firm* — Volpe Koenig

(57) ABSTRACT

A thermoelectric conversion material having a high dimensionless figure of merit ZT includes: a large number of polycrystalline grains which include a skutterudite-type crystal structure containing Yb, Co, and Sb; and an intergranular layer which is between the neighboring polycrystalline grains and includes crystals in which an atomic ratio of O to Yb is more than 0.4 and less than 1.5. A method for manufacturing a thermoelectric conversion material includes: a weighing step; a mixing step; a ribbon preparation step by rapidly cooling and solidifying a melt of the raw (Continued)

materials by using a rapid liquid cooling solidifying method; a first heat treatment step including heat treating in an inert atmosphere with an adjusted oxygen concentration; a second heat treatment step including heat treating in a reducing atmosphere; and manufacturing the thermoelectric conversion material by a pressure sintering step in an inert atmosphere.

20 Claims, 16 Drawing Sheets

(51) Int. Cl.
*B22F 9/04* (2006.01)
*C01G 51/00* (2006.01)
*C22C 12/00* (2006.01)
*H01L 35/32* (2006.01)
*H01L 35/34* (2006.01)
*B82Y 30/00* (2011.01)

(52) U.S. Cl.
CPC .............. *C22C 12/00* (2013.01); *H01L 35/32* (2013.01); *H01L 35/34* (2013.01); *B22F 2009/048* (2013.01); *B82Y 30/00* (2013.01); *C01P 2002/01* (2013.01); *C01P 2002/70* (2013.01); *C01P 2004/03* (2013.01); *C01P 2004/04* (2013.01)

(56) References Cited

FOREIGN PATENT DOCUMENTS

| | | |
|---|---|---|
| JP | 2004-076046 A1 | 3/2004 |
| JP | 2013-506312 A | 2/2013 |
| JP | 2013-219095 A | 10/2013 |
| JP | 2016-058558 A | 4/2016 |

OTHER PUBLICATIONS

J. Yang, et al., "Dual-frequency resonant phonon scattering $Ba_xR_yCo_4Sb_{12}$(R=La, Ce and Sr)", Applied Physics Letters 90, 192111, (2007).

Xun Shi, et al., "Multiple-filled Skutterudites: High Thermoelectric Figure of Merit through Separately Optimizing Electrical and Thermal Transports", J. Am. Chem. Soc., 133 (2011), p. 7837-7846.

Shanyu Wang, et al., "High-performance n-type $Yb_xCo_4Sb_{12}$: from partially filled skutterudite towards composite thermoelectrics", NPG Asia Materials (2016) 8, e285, p. 1-11.

International Search Report, PCT/JP/2019/000945, dated Apr. 2, 2019, 2 pgs.

* cited by examiner

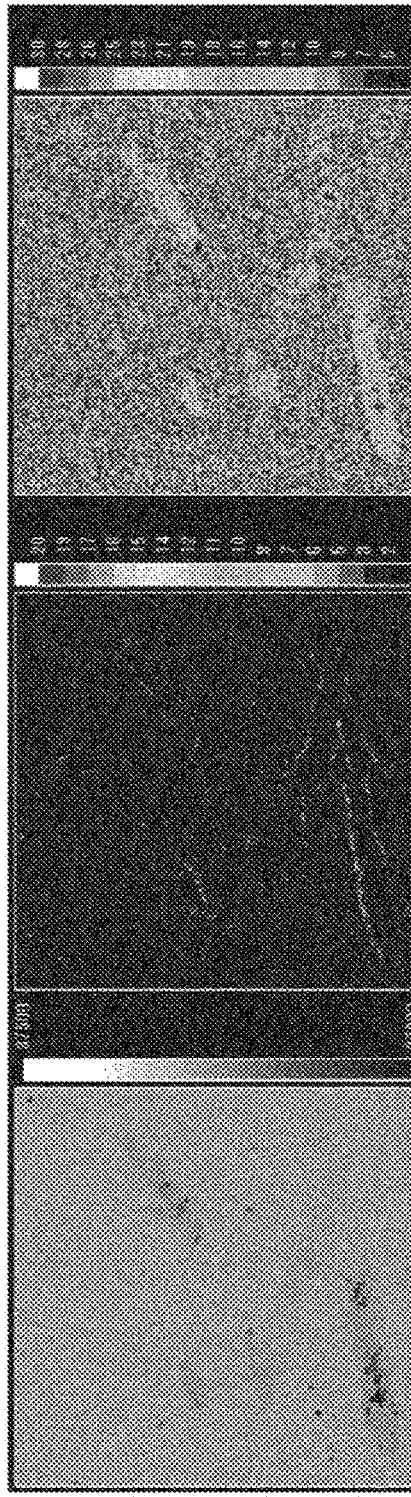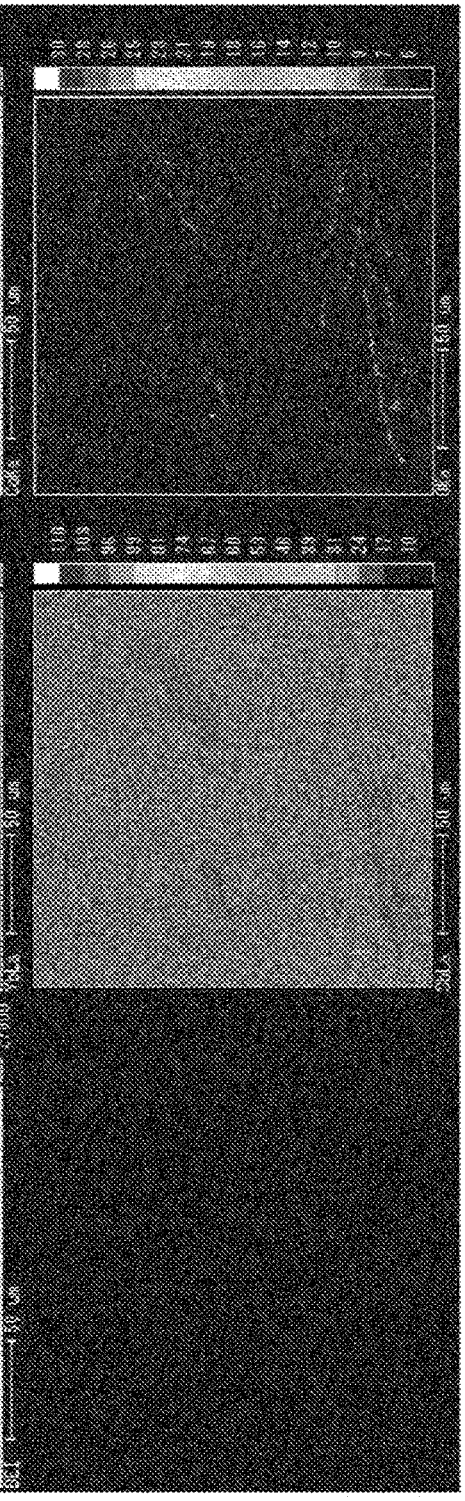

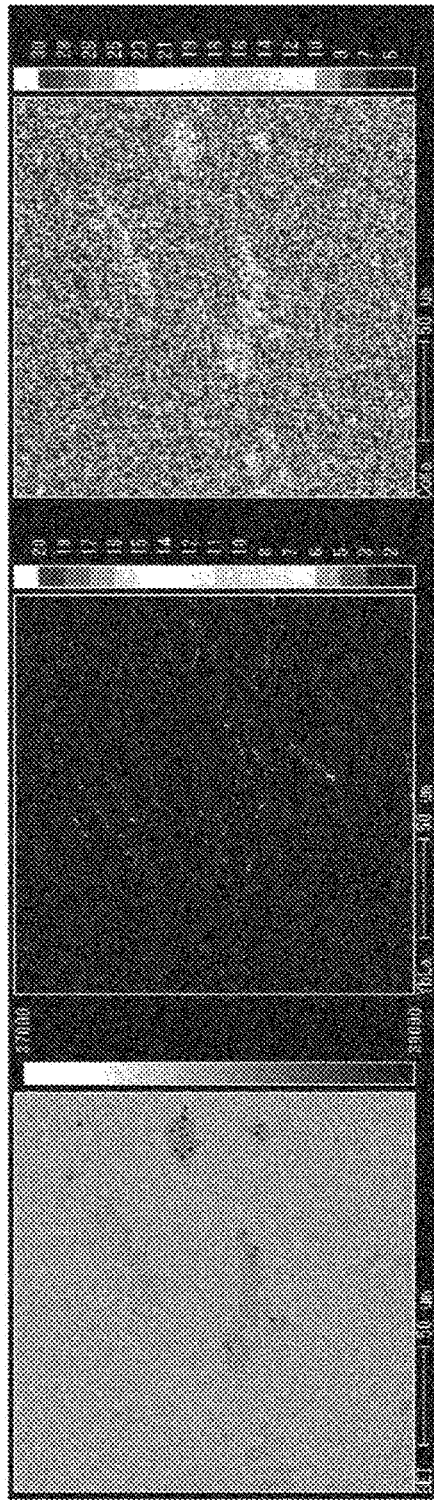
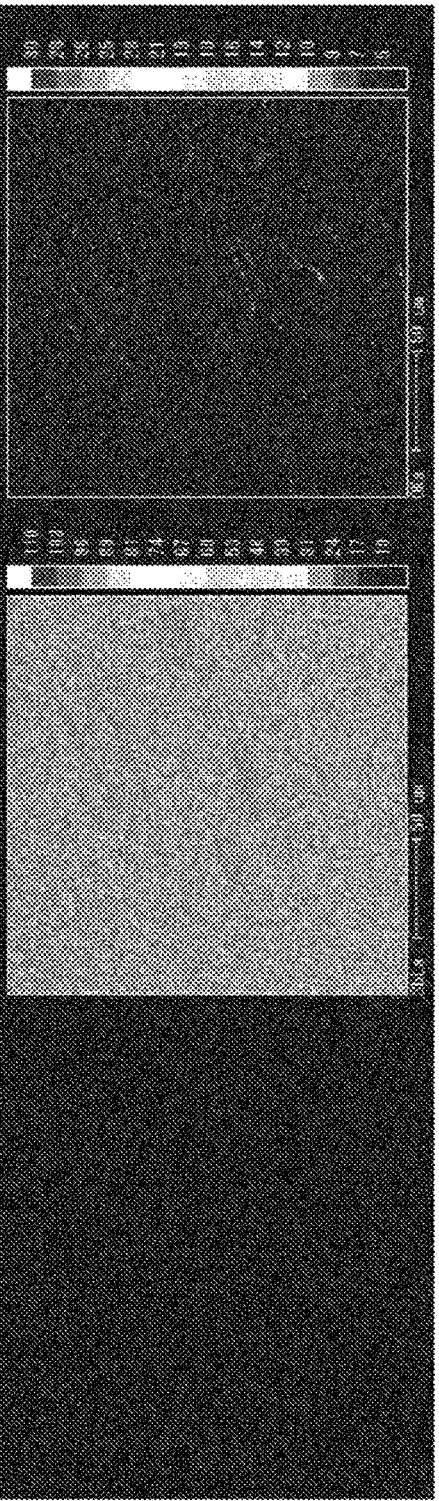
FIG. 8A
FIG. 8B
FIG. 8C
FIG. 8D
FIG. 8E

EDX Analysis Value (at%)

| Position | Co | Sb | Yb | O |
|---|---|---|---|---|
| 1 | 5 | 15.5 | 53.1 | 26.4 |
| 2 | 5 | 20 | 50 | 25 |
| 3 | 2.4 | 8.4 | 58.8 | 30.4 |
| 4 | 20.2 | 72.3 | 0.3 | 7.2 |
| 5(Main Phase) | 21.7 | 70.4 | 1.4 | 6.5 |

Yb、O Rich Layer
$Yb_2O$

FIG. 12C

EDX Analysis Value (at%)

| Position | Co | Sb | Yb | O |
|---|---|---|---|---|
| 1 | 9.4 | 30.5 | 54.5 | 5.6 |
| 2(Main Phase) | 23.4 | 70.8 | 1.5 | 4.3 |
| 3 | 1.2 | 3.7 | 67.2 | 27.9 |
| 4 | 1.5 | 3.1 | 68.2 | 27.2 |

Yb、O Rich Layer
$Yb_5O_2$ ($Yb_{2.5}O$)

Predetermined
Crystal Grains

Intergranular
Layer

Interface of
Intergranular Layer – a

Interface of
Intergranular Layer – b

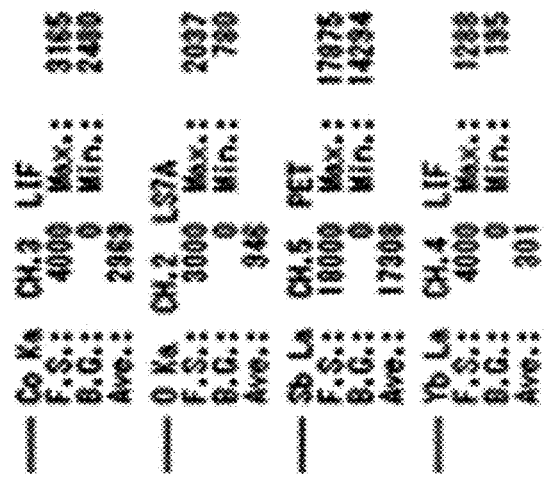
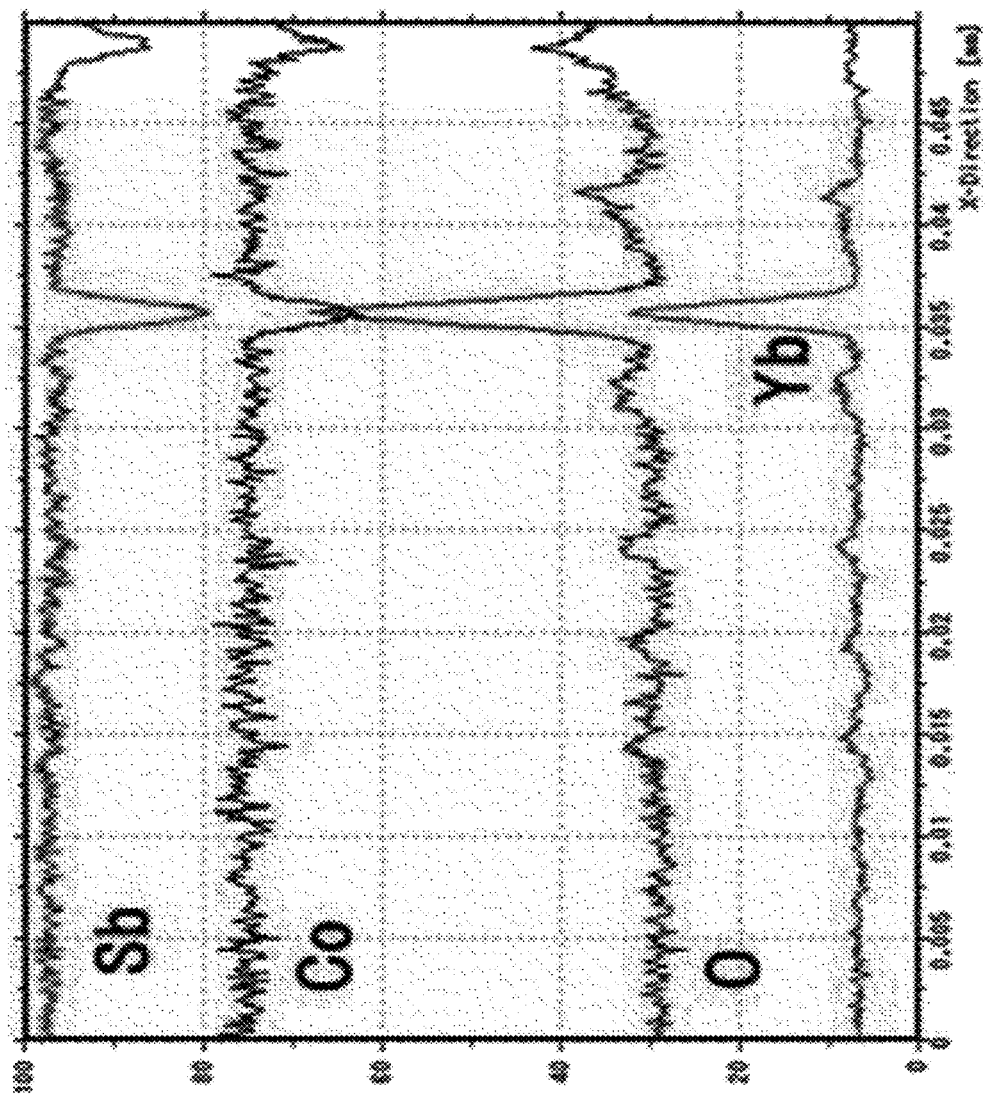
FIG. 15B

THERMOELECTRIC CONVERSION MATERIAL, THERMOELECTRIC CONVERSION MODULE, AND METHOD FOR MANUFACTURING THERMOELECTRIC CONVERSION MATERIAL

TECHNICAL FIELD

The present invention relates to a thermoelectric conversion material, a thermoelectric conversion module, and a method for manufacturing a thermoelectric conversion material.

BACKGROUND ART

Currently, a huge amount of thermal energy is being emitted from large-scale power generation systems such as thermal power plants, steel-related furnaces, refuse incinerators, automobiles running on fossil fuel engines, and the like. Part of the discharged thermal energy is used as a heat source for hot water supply or heating, but most of it is discarded without being used. Waste thermal energy which is discarded without being used is called unused waste thermal energy or the like. Efficient use and recovery of unused waste thermal energy leads to the reduction of energy consumption of the entire social system, and contributes greatly to solving energy problems and environmental problems such as global warming.

Thermoelectric power generation systems which convert thermal energy into electric energy have received attention in the sense of recycling unused waste thermal energy. The thermoelectric power generation system is a power generation system which uses a thermoelectric conversion module having a plurality of elements in each of which n-type thermoelectric conversion material having electrons as carriers and p-type thermoelectric conversion material having holes as carriers are connected via a conductive material. When a temperature gradient occurs between one side and the other side of the thermoelectric conversion module, the electrons in the high temperature region are activated in the n-type thermoelectric conversion material (the electrons in valence band are excited to conduction band), the electrons are diffused to the low temperature region to generate thermoelectromotive force, and the high temperature side has a high potential. On the other hand, in the p-type thermoelectric conversion material, the holes in the high temperature region are activated, the holes move to the low temperature region to generate thermoelectromotive force, and the low temperature side has a high potential. When the n-type thermoelectric conversion material and the p-type thermoelectric conversion material are connected via a conductive material, they behave like a kind of battery because a current flows between them (called the Seebeck effect). The thermoelectric power generation system supplies the electric energy thus obtained.

Specifically, the thermoelectric conversion material used in the thermoelectric conversion module directly exchanges energy by solid, discharges no carbon dioxide gas, and eliminates the necessity of being cooled with a refrigerant such as a fluorocarbon gas. Therefore, its value has been reviewed in recent years as an energy technology which coexists with the environment.

Technologies relating to thermoelectric conversion materials are disclosed in, for example, Non-Patent Literatures 1 to 3 and Patent Literature 1.

Non-Patent Literature 1 reports low temperature transport properties of polycrystalline binary component-filled skutterudite of $Ba_xR_yCo_4Sb_{12}$ (R=La, Ce, and Sr).

Non-Patent Literature 2 reports that a skutterudite $CoSb_3$ having multiple co-fillers Ba, La, and Yb was synthesized and that and a very high thermoelectric figure of merit (dimensionless figure of merit) ZT=1.7 was achieved at 850K.

Non-Patent Literature 3 reports that a study on a high performance n-type $Yb_xCo_4Sb_{12}$-filled skutterudite (x=0.2 to 0.6) showed a maximum ZT of 1.5 at 850K for $Yb_{0.3}Co_4Sb_{12}$. Note that Non-Patent Literature 3 states that annealing was performed at 750° C. for 168 h (7 days) to obtain the product. In addition, Non-Patent Literature 3 states that $Yb_2O_3$ and $YbSb_2$ were produced as a result of performing powder X-ray diffraction (XRD) after annealing.

In addition, Patent Literature 1 describes a method of producing a filled skutterudite-based alloy, including melting an alloy base material composed of a rare earth metal R (where R is at least one of La, Ce, Pr, Nd, Sm, Eu, and Yb), a transition metal T (where T is at least one of Fe, Co, Ni, Os, Ru, Pd, Pt, and Ag), and a metal antimony (Sb), and rapidly cooling the melt by a strip casting method.

This Patent Literature 1 states that a substantially uniform filled skutterudite-based alloy can be easily produced in a large amount by a casting method using the strip casting method. In addition, this Patent Literature 1 states that, since the steps of crushing and sintering can be omitted to use the manufactured filled skutterudite-based alloy as it is for thermoelectric conversion elements, the production cost of thermoelectric conversion elements can be significantly reduced.

CITATION LIST

Patent Literature

Patent Literature 1: Japanese Patent Application Publication No. 2004-76046

Non-Patent Literature

Non-Patent Literature 1: J. Yang, et al., "Dual-frequency resonant phonon scattering in BaxRyCo4Sb12 (R=La, Ce and Sr)", Applied Physics Letters 90, 192111, (2007)

Non-Patent Literature 2: Xun Shi, et al., "Multiple-filled Skutterudites: High Thermoelectric Figure of Merit through Separately Optimizing Electrical and Thermal Transports", J. Am. Chem. Soc., 133 (2011), p7837-7846

Non-Patent Literature 3: Shanyu Wang, et al., "High-performance n-type YbxCo4Sb12: from partially filled skutterudite towards composite thermoelectrics", NPG Asia Materials (2016) 8, e285, p1-11

SUMMARY OF INVENTION

Technical Problem

The performance of a thermoelectric conversion material is evaluated by a value called the dimensionless figure of merit ZT, and ZT larger than 1 is a standard for practical use. Note that it is said that the theoretical power generation efficiency is about 9% for the thermoelectric conversion material with ZT≈1.

$$ZT = S^2 \sigma T / \kappa \qquad (1)$$

Here, in the above formula (1), S: Seebeck coefficient, σ: electrical conductivity, κ: thermal conductivity, T: absolute temperature.

As shown in the above formula (1), a thermoelectric conversion material having good performance, that is, a high efficiency is a material having a large electrical conductivity σ and Seebeck coefficient S, and a small thermal conductivity κ. However, in general, thermoelectric conversion materials have a correlation that a material having a higher electrical conductivity σ has a higher thermal conductivity κ and a material having a lower electrical conductivity σ has a lower thermal conductivity κ. For this reason, it is difficult to increase the dimensionless figure of merit ZT.

The thermoelectric conversion material described in Non-Patent Literature 1 filled with Ba alone has a problem that the dimensionless figure of merit ZT is low because the electrical conductivity σ is low and the thermal conductivity κ is high. In addition, even when a high ZT is obtained as in Non-Patent Literatures 1 and 2 and Patent Literature 1, introducing an active material such as Ba, La, or Sr causes a problem of significantly lowering reliability. Note that, in order to obtain the product described in Non-Patent Literature 3, long-time annealing is required as described above, which is not suitable for mass production.

The present invention has been made in view of the above circumstances, and an object of the present invention is to provide a thermoelectric conversion material having a high dimensionless figure of merit ZT and high reliability, a thermoelectric conversion module, and a method for manufacturing a thermoelectric conversion material.

Solution to Problem

The object of the present invention can be achieved by the following means.

A first thermoelectric conversion material according to the present invention includes: a large number of polycrystalline grains which include a skutterudite-type crystal structure containing Yb, Co, and Sb; and an intergranular layer which is between the neighboring polycrystalline grains and includes crystals in which an atomic ratio of O to Yb is more than 0.4 and less than 1.5.

A thermoelectric conversion module according to the present invention includes a plurality of elements. Each of the elements includes: the first thermoelectric conversion material according to the present invention; a second thermoelectric conversion material including a skutterudite-type crystal structure and having a phase opposite to the first thermoelectric conversion material; and a conductive material connecting the first thermoelectric conversion material and the second thermoelectric conversion material.

A method for manufacturing a thermoelectric conversion material according to the present invention includes: weighing a raw material containing Yb, a raw material containing Co, and a raw material containing Sb; meltingly mixing the raw materials; preparing a ribbon by rapidly cooling and solidifying a melt of the raw materials by using a rapid liquid quench method; obtaining polycrystalline grains by first heat treating including heat treating the prepared ribbon in an inert atmosphere with an adjusted oxygen concentration and crushing; second heat treating including heat treating the polycrystalline grains, heat treated in the first heat treating, in a reducing atmosphere; and manufacturing a thermoelectric conversion material by pressure sintering the polycrystalline grains, heat treated in the second heat treating, in an inert atmosphere.

Advantageous Effects of Invention

The present invention makes it possible to provide a thermoelectric conversion material having a high dimensionless figure of merit ZT and high reliability, a thermoelectric conversion module, and a method for manufacturing a thermoelectric conversion material.

BRIEF DESCRIPTION OF DRAWINGS

FIG. 4 shows a state before the attachment of an upper substrate.

FIG. 5 shows a state after the attachment of an upper substrate.

FIGS. 7A to 7E show an EPMA image of sample No. 10 being an Example. In FIG. 7A is an EPMA image, and FIGS. 7B to 7E are diagrams showing the results of elemental mapping performed on Yb, Co, Sb, and O, respectively. Each scale bar below FIGS. 7A to 7E shows 50 μm.

FIGS. 8A to 8E show an EPMA image of sample No. 16 being an Example. In FIG. 8Aa is an EPMA image, and FIGS. 8B to 8E are diagrams showing the results of elemental mapping performed on Yb, Co, Sb, and O, respectively. Each scale bar below FIGS. 8A to 8E shows 50 μm.

In FIG. 9A is an EPMA image, and FIGS. 9B to 9E are diagrams showing the results of elemental mapping performed on Yb, Co, Sb, and O, respectively. Each scale bar below FIGS. 9A to 9E shows 50 μm.

In FIG. 10A is a TEM photograph of sample No. 10, and FIGS. 10B to 10E are diagrams showing the results of elemental mapping performed on Co, Sb, Yb, and O, respectively. Each scale bar below FIGS. 10B to 10E shows 20.00 nm.

FIG. 12C is a table showing EDX analysis values (at %) at positions 1 to 4 in FIGS. 12A and 12B.

In FIG. 13A is a TEM photograph, FIG. 13B is an electron beam diffraction pattern of position 1 (polycrystalline grains) in FIG. 13A, FIG. 13C is an electron beam diffraction pattern of position (intergranular layer) in FIG. 13A, FIG. 13D is an electron beam diffraction pattern of position 3 (interface of intergranular layer—a) in FIG. 13A, and FIG. 13E is an electron beam diffraction pattern of position 3 (interface of intergranular layer—b) in FIG. 13A. The scale bar at the lower right of FIG. 13A shows 100 nm.

FIG. 15B is a graph showing the results of high-sensitivity line analysis performed for the line analysis position shown in FIG. 15A.

DESCRIPTION OF EMBODIMENTS

Next, with reference to the drawings as appropriate, a detailed description is provided on an embodiment of the thermoelectric conversion material, the thermoelectric conversion module, and the method for manufacturing a thermoelectric conversion material according to the present invention.

[Thermoelectric Conversion Material]

Figure 1A:
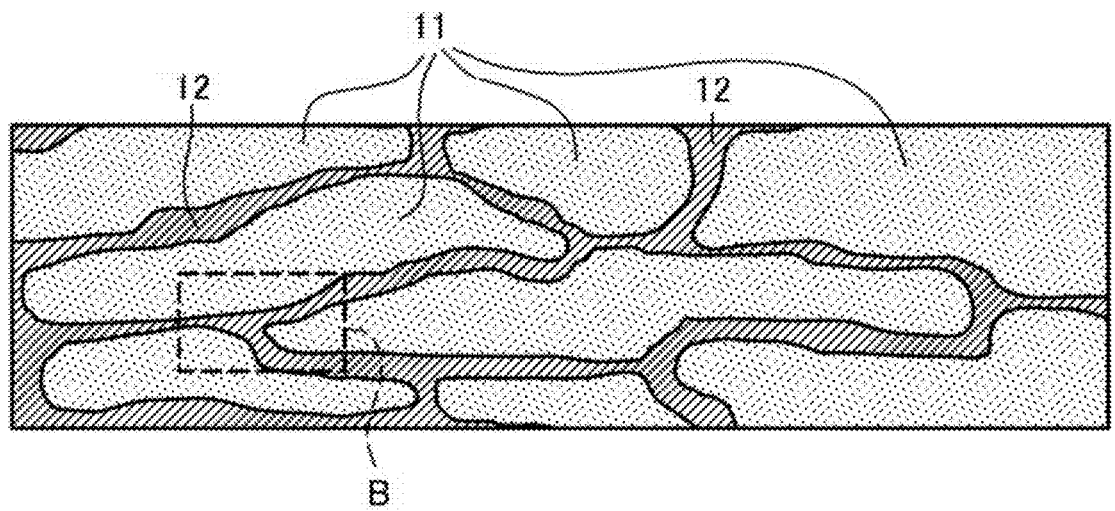
FIG. 1A is a schematic diagram schematically showing the structure of the thermoelectric conversion material according to the present embodiment.
Figure 1B:
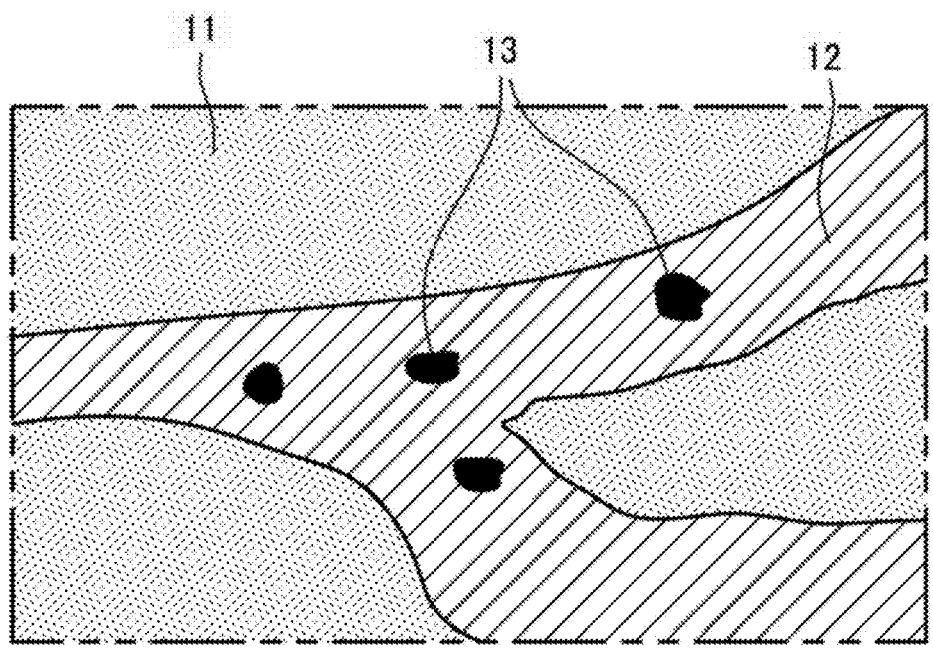
FIG. 1B is an enlarged diagram of area B of FIG. 1A.

FIG. 1A is a schematic diagram schematically showing the structure of the thermoelectric conversion material according to the present embodiment. FIG. 1B is an enlarged diagram of area B of FIG. 1A. Note that FIGS. 1A and 1B are schematically illustrated from an electron beam microanalyzer (EPMA) image.

As shown in FIG. 1A, the thermoelectric conversion material 1 according to the present embodiment (not shown in FIGS. 1A and 1B, see FIG. 4) includes a structure including: a large number of polycrystalline grains 11 which include a skutterudite-type crystal structure containing Yb, Co, and Sb; and an intergranular layer 12 which is between the neighboring polycrystalline grains 11 and includes crystals 13 in which an atomic ratio of O to Yb is more than 0.4 and less than 1.5 (see FIG. 1B). As described later, the polycrystalline grains 11 are crushed grains manufactured in the manufacturing process, and the thermoelectric conversion material 1 according to the present embodiment is a sintered body obtained by pressure-sintering the polycrystalline grains 11. Note that a reaction intermediate product (not shown) between the polycrystalline grains 11 and the precipitated crystal grains (not shown) may coexist in the intergranular layer 12. This thermoelectric conversion material 1 is suitably obtained by the later-described method for manufacturing a thermoelectric conversion material.

The skutterudite-type crystal structure containing Yb, Co, and Sb refers to a crystal structure (cubic crystal) having Co surrounded by a vertex-sharing octahedral structure of Sb, with the gaps of the crystal structure filled with Yb (referred to as a filled skutterudite structure or the like). As such a skutterudite-type crystal structure containing Yb, Co, and Sb, it is possible to preferably use one represented by the composition formula $Yb_xCo_4Sb_{12}$ (where x is more than 0 and 0.3 or less). Note that x is preferably 0.1 or more, and more preferably 0.2 or more. In addition, x is preferably less than 0.3. The polycrystalline grains 11 including the crystal grains of such a crystal structure, preferably the polycrystalline grains 11 including the crystal grains of the crystal structure represented by the above composition formula, suitably function as the thermoelectric conversion material 1.

Preferably, this thermoelectric conversion material 1 has an anisotropy in at least one of a thermal conductivity and an electrical conductivity. Such anisotropy is obtained by arranging the polycrystalline grains 11 forming the thermoelectric conversion material 1 and having different aspect ratios in substantially parallel directions, as shown in FIG. 1A. That is, it is considered that the anisotropy of electrical conductivity or thermal conductivity occurs because the number of the intergranular layers 12 passing per unit path differs due to the anisotropy of the shape of the polycrystalline grains 11 having different aspect ratios.

As described in the manufacturing method described later, the polycrystalline grains 11 having different aspect ratios can be obtained by, for example, the manufacture including preparing a ribbon by using a rapid liquid quench method, then crushing the ribbon to obtain polycrystalline grains 11 as crushed particles, and tapping and then pressure-sintering the polycrystalline grains 11. That is, such anisotropy can allow the shapes of the polycrystalline grains 11 which have been tapped and then pressure-sintered to have different aspect ratios, and the shapes are arranged in substantially parallel directions. The thermal conductivity and electrical conductivity are given by the shapes of the polycrystalline grains 11 which have been tapped and then pressure-sintered and by the intergranular layer 12 which has been formed accordingly. Thus, in many cases, the anisotropy directions of thermal conductivity and electrical conductivity match. Preferably, in order to easily obtain anisotropy, the polycrystalline grains 11 are vibrated by tapping or the like as described above to improve their stability and then pressure-sintered.

The size of the polycrystalline grains 11 is preferably, for example, 10 to 500 μm in maximum length. Note that the maximum length means, for example, a length between two points which are farthest possible from each other in one polycrystalline grain 11 in an image captured by an electron micrograph or the like. When the size of the polycrystalline grains 11 is within this range, it becomes easy to control the oxygen concentration in the sintered body after pressure sintering. The size of the polycrystalline grains 11 can be controlled by, for example, appropriately changing the crushing time when the ribbon is crushed.

The polycrystalline grains 11 are formed to include a large number of crystal grains including a skutterudite-type crystal structure containing Yb, Co, and Sb as a metal structure. Each crystal grain has a different direction of atomic arrangement, thus forming a region with a disturbed atomic arrangement of the crystal structure between neighboring crystal grains, that is, a grain boundary (crystal grain boundary). The size of the crystal grains forming the polycrystalline grains 11 is preferably, for example, 1 to 50 µm, but is not limited to this range. When the size of the crystal grains is within this range, high compactness can be obtained. The size of the crystal grains can be controlled by, for example, appropriately changing the rapidly cooling rate in the preparing a ribbon or the heat treatment temperature in the first heat treating, the second heat treating, and the pressure sintering.

The thermoelectric conversion material 1 includes: a large number of polycrystalline grains 11 described above; and an intergranular layer 12 which is between the neighboring polycrystalline grains 11 and includes crystals 13 in which an atomic ratio of O to Yb is more than 0.4 and less than 1.5. In the crystals 13 precipitated in the intergranular layer 12, the atomic ratio of 0 to Yb is preferably 1 or less, more preferably 0.7 or less, and further preferably 0.67 or less.

Note that, in the present embodiment, it suffices that the intergranular layer 12 includes the crystal 13 in which an atomic ratio of O to Yb is more than 0.4 and less than 1.5. In other words, in the crystals 13 contained in the intergranular layer 12, the atomic ratio of O to Yb does not have to be entirely within the above range. The crystals precipitated in the intergranular layer 12 of the thermoelectric conversion material 1 may be mixed with crystals in which the atomic ratio of O to Yb is 0.4 or less, or may be mixed with crystals in which the atomic ratio of O to Yb is 1.5 or more.

When the atomic ratio of O to Yb of the crystals 13 precipitated in the intergranular layer 12 is within the above range, the crystals 13 have a high ratio of metal Yb while containing an oxide of Yb. The reason for this is presumably because oxygen is removed from the bond of Yb oxide, such as $Yb_2O_3$ for example, which has a low electrical conductivity σ and a low thermal conductivity κ and is extremely stable, so that a stable oxide having oxygen defects is generated. Moreover, it is considered that this Yb oxide having defects needs to generate electrons in order to secure electrical neutrality, and therefore the electrical conductivity is inevitably high. Therefore, it is considered that the electrical conductivity σ can be increased and the dimensionless figure of merit ZT can be increased while reducing the thermal conductivity κ of the thermoelectric conversion material 1. It is considered that the above-described anisotropy of electrical conductivity or thermal conductivity occurs because the number of the intergranular layers 12 passing per unit path (that is, the intergranular layers 12 containing the crystals 13 in which the atomic ratio of O to Yb is within the above range) differs due to the anisotropy of the shape of the polycrystalline grains 11 having different aspect ratios.

Figure 2:
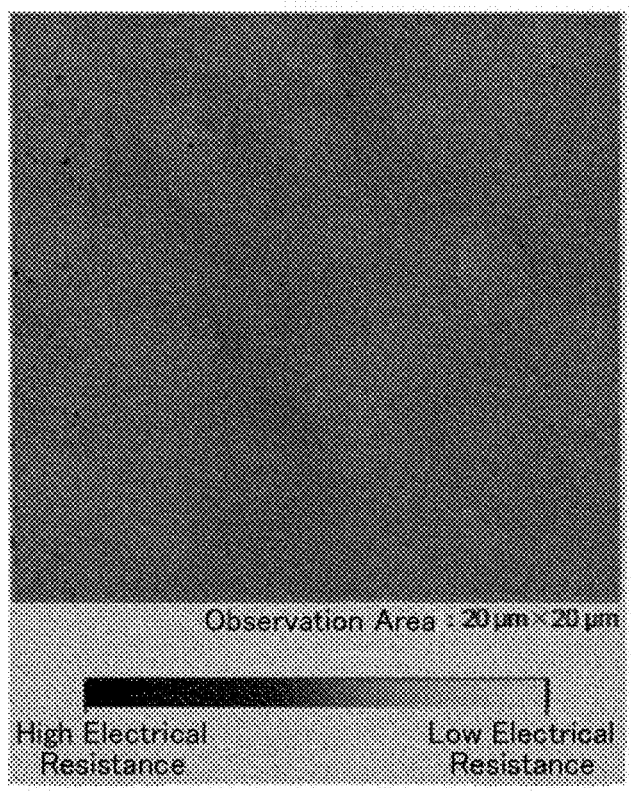
FIG. 2 is an observation view (observation area of 20 μm×20 μm) mapping the electrical resistance of the thermoelectric conversion material according to the present embodiment.
Figure 3:
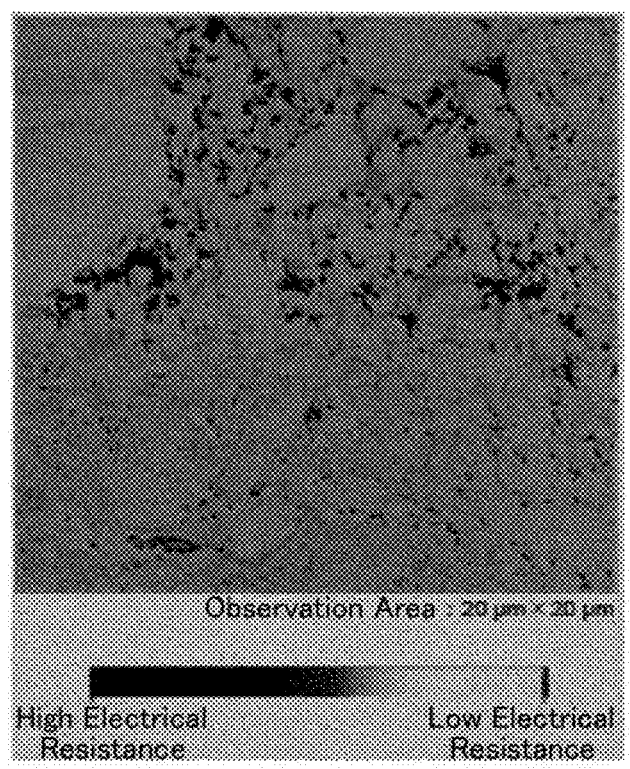
FIG. 3 is an observation view (observation area of 20 μm×20 μm) mapping the electrical resistance of an example of a thermoelectric conversion material according to the conventional example, which is not treated at all in terms of the atmosphere of pressure sintering pretreatment.

Here, FIG. 2 is an explanatory diagram (observation area of 20 µm×20 µm) mapping the electrical resistance of the thermoelectric conversion material according to the present embodiment. Regarding this FIG. 2, the atmosphere of pressure sintering pretreatment was set to 3% hydrogen, pressure was applied with 0.1 MPa argon, and the oxygen concentration of the sintered body was set to 470 volume ppm to form a thermoelectric conversion material, the electrical resistance of which was observed with a scanning probe microscope. FIG. 3 is an explanatory diagram (observation area of 20 µm×20 µm) mapping the electrical resistance of a thermoelectric conversion material according to the conventional example. Regarding this FIG. 3, the electrical resistance of the thermoelectric conversion material which was not treated at all in terms of the atmosphere of pressure sintering pretreatment was observed with a scanning probe microscope.

It can be understood that the thermoelectric conversion material 1 (see FIG. 4) according to the present embodiment shown in FIG. 2 has less black portions having a high electrical resistance as compared with the thermoelectric conversion material according to the conventional example shown in FIG. 3 and has a low electrical resistance (high electrical conductivity σ). Note that the electrical resistance per unit area shown in FIG. 2 was 6.3 µΩm, and the electrical resistance per unit area shown in FIG. 3 was 32.2 µΩm.

The atomic ratio of O to Yb of the crystals 13 precipitated in the intergranular layer 12 is preferably 0.5 (that is, $Yb_2O$) or 0.67 (that is, $Yb_3O_2$). In that case, a stable oxide having oxygen defects can be stably maintained in the intergranular layer 12.

The atomic ratio of O to Yb of the crystals 13 precipitated in the intergranular layer 12 can be obtained by performing first heat treating, second heat treating, and pressure sintering in the manufacturing method described later.

The thermoelectric conversion material 1 according to the present embodiment preferably has an oxygen concentration of 1,200 volume ppm or less, more preferably 700 volume ppm or less, and further preferably 510 volume ppm or less. In that case, it is possible to easily, that is, without performing the second heat treatment step S5 described later at a hydrogen concentration of 100%, obtain the intergranular layer 12 having the crystals 13 in which an atomic ratio of O to Yb is more than 0.4 and less than 1.5. As a result, the electrical resistance of the thermoelectric conversion material 1 can be lowered. On the other hand, the lower limit of the oxygen concentration is preferably as low as possible, and it is preferably 0 volume ppm, but in reality is preferably 50 volume ppm or more in consideration of measurement accuracy and the like.

The thickness of the above-described intergranular layer 12 is preferably 5 nm or more and 1 µm or less. When the thickness of the intergranular layer 12 is within this range, the number of crystals 13 present in the intergranular layer 12 increases, and the oxide having high resistance can be reduced. Therefore, since the thermal conductivity κ of the thermoelectric conversion material 1 is reduced and its electrical conductivity σ is also increased, the dimensionless figure of merit ZT can be increased. From the viewpoint of more reliably obtaining this effect, the thickness of the intergranular layer 12 is further preferably 5 nm or more and 100 nm or less.

Note that the thickness of the above-described intergranular layer 12 can be controlled by, for example, appropriately changing the rapidly cooling rate in the preparing a ribbon or the heat treatment temperature in the pressure sintering.

The thickness of the intergranular layer 12 can be observed and measured by, for example, a scanning electron microscope (SEM) or a transmission electron microscope (TEM). The thickness of the intergranular layer 12 can be measured by, for example, measuring between any two points for which the distance between the neighboring polycrystalline grains 11 is shortest when observing an area including the intergranular layer 12.

The thermoelectric conversion material 1 according to the present embodiment may contain impurities as long as they do not adversely affect the thermoelectric conversion.

The thermoelectric conversion material 1 according to the present embodiment includes: a large number of polycrystalline grains 11 which include a skutterudite-type crystal structure containing Yb, Co, and Sb; and an intergranular layer 12 which is between the neighboring polycrystalline grains 11 and includes crystals 13 in which an atomic ratio of O to Yb is more than 0.4 and less than 1.5. In addition, the thermoelectric conversion material 1 according to the present embodiment is not introduced with an active material such as Ba, La, or Sr. Therefore, the thermoelectric conversion material 1 according to the present embodiment has a high dimensionless figure of merit ZT and high reliability.

[Thermoelectric Conversion Module]

Next, description is provided for the thermoelectric conversion module according to the present embodiment.

Figure 4:
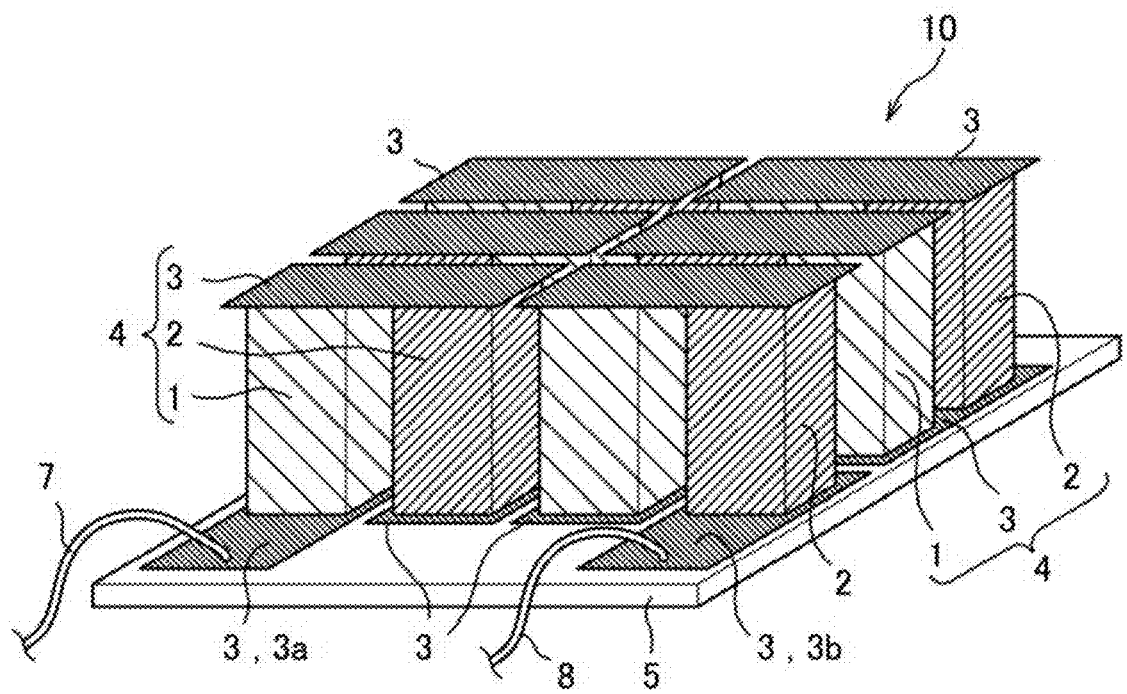
FIG. 4 is a perspective view showing the configuration of the thermoelectric conversion module according to the present embodiment.
Figure 5:
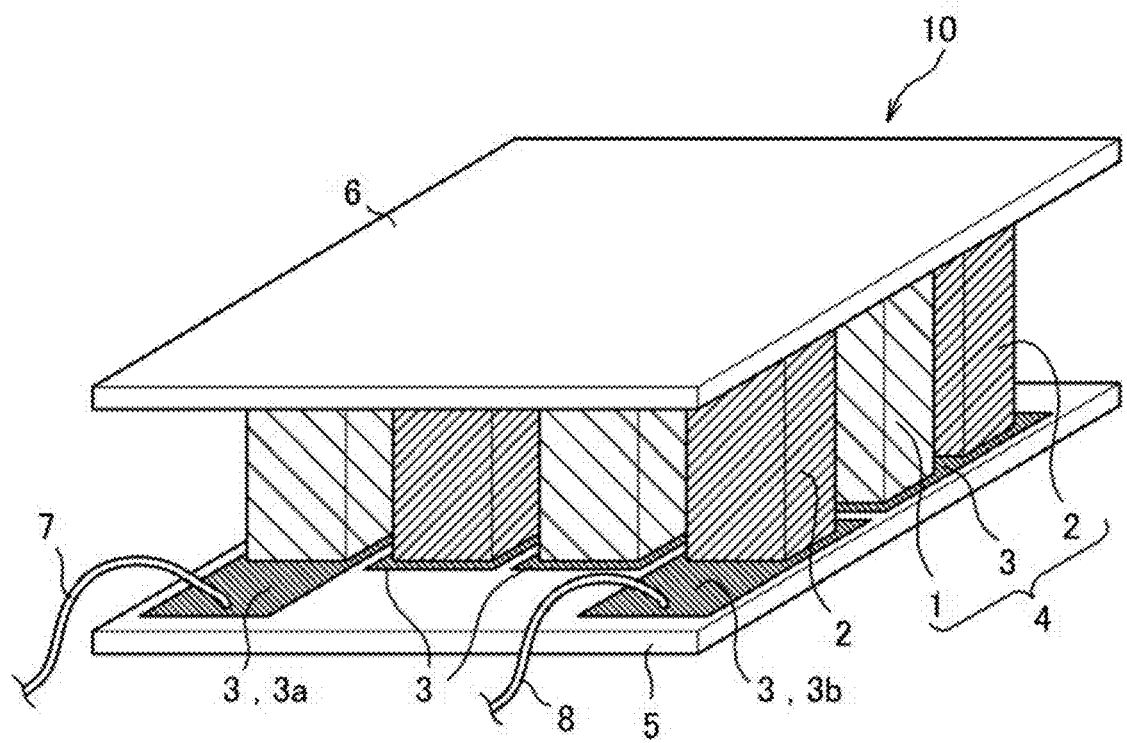
FIG. 5 is a perspective view showing the configuration of the thermoelectric conversion module according to the present embodiment.

FIGS. 4 and 5 are each a perspective view showing the configuration of the thermoelectric conversion module according to the present embodiment. FIG. 4 shows a state before the attachment of an upper substrate 6, and FIG. 5 shows a state after the attachment of the upper substrate 6.

As shown in FIGS. 4 and 5, the thermoelectric conversion material 1 according to the present embodiment described above can be mounted on the thermoelectric conversion module 10. The thermoelectric conversion module 10 has a plurality of elements 4 in each of which the pillar-shaped thermoelectric conversion material 1 and the pillar-shaped thermoelectric conversion material 2 having a phase opposite to the thermoelectric conversion material 1 are connected via a conductive material 3 at their end portions. Although not particularly limited, as shown in FIGS. 4 and 5, each of the elements 4 can connect the thermoelectric conversion material 1 and the thermoelectric conversion material 2 of an opposite phase alternately and electrically in series via the conductive material 3. The elements 4, each of which is formed by connecting the thermoelectric conversion material 1, the thermoelectric conversion material 2 of an opposite phase, and the conductive material 3, are arranged between the lower substrate 5 and the upper substrate 6 (see FIG. 5). Note that, among the conductive materials 3, a first conductive material 3a is connected to the thermoelectric conversion material 1, and a second conductive material 3b is connected to the thermoelectric conversion material 2. Then, the first conductive material 3a is connected to the first cord 7 for voltage extraction, and the second conductive material 3b is connected to the second cord 8 for voltage extraction.

Here, for example, the opposite-phase thermoelectric conversion material 2 is n-type when the thermoelectric conversion material 1 is p-type, and is p-type when the thermoelectric conversion material 1 is n-type.

Examples of the conductive material 3 include a thin plate material, a film, and a thin film using copper, silver, gold, platinum, aluminum, or an alloy of any one metal selected from these. The conductive material 3 may be any material as long as it has conductivity, and is not limited to the above-mentioned metals and forms. For example, if the conductive material 3 is arranged on the low temperature side, it is possible to use a film or the like formed of a conductive polymer.

As the lower substrate 5 and the upper substrate 6, it is possible to use, for example, a plate material formed of aluminum nitride (AlN), silicon nitride ($Si_3N_4$), alumina oxide ($Al_2O_3$), or the like.

By, for example, heating the upper substrate 6 or bringing it into contact with a high temperature portion, the thermoelectric conversion module 10 of the embodiment described above can generate a temperature gradient in the same direction with respect to the thermoelectric conversion material 1 and the opposite-phase thermoelectric conversion material 2. As a result, a thermoelectromotive force is generated by the Seebeck effect in the thermoelectric conversion material 2 having a phase opposite to the thermoelectric conversion material 1. Here, in thermoelectric conversion material 2 having a phase opposite to the thermoelectric conversion material 1, the thermoelectromotive force is generated in the direction opposite to the temperature gradient, and the thermoelectromotive force is added without being canceled. Therefore, the thermoelectric conversion module 10 can generate a large thermoelectromotive force. In addition to the above-described embodiment, the temperature gradient may be applied by cooling the lower substrate 5 or bringing it into contact with a low temperature portion. In addition, the lower substrate 5 may be cooled or brought into contact with the low temperature portion while the upper substrate 6 is heated or brought into contact with the high temperature portion.

The thermoelectric conversion module according to the present embodiment described above uses the thermoelectric conversion material 1 according to the present embodiment mentioned above. Therefore, the thermoelectric conversion module according to the present embodiment has a high dimensionless figure of merit ZT and high reliability for the same reason as that described for the thermoelectric conversion material 1 according to the present embodiment.

[Method for Manufacturing Thermoelectric Conversion Material]

Next, description is provided for a method for manufacturing a thermoelectric conversion material according to the present embodiment.

Figure 6:
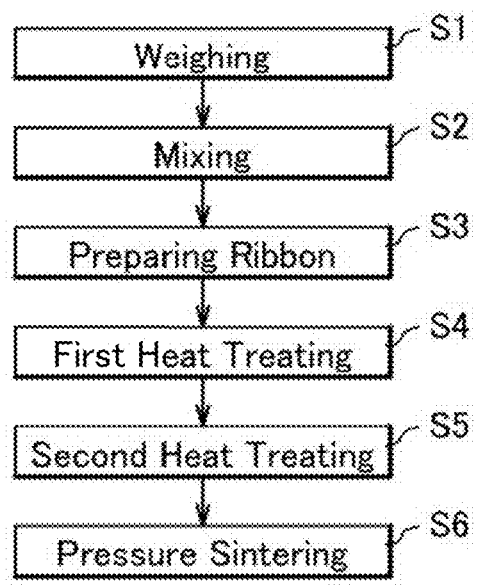
FIG. 6 is a flowchart showing the content of the method for manufacturing a thermoelectric conversion material according to the present embodiment.

FIG. 6 is a flowchart showing the content of the method for manufacturing a thermoelectric conversion material according to the present embodiment (hereinafter simply referred to as the present manufacturing method). The present manufacturing method is, for example, a manufacturing method for manufacturing the thermoelectric conversion material 1 according to the present embodiment described above.

As shown in FIG. 6, the present manufacturing method includes a weighing step S1, a mixing step S2, a ribbon preparation step S3, a first heat treatment step S4, a second heat treatment step S5, and a pressure sintering step S6. In the present manufacturing method, since the amount of oxidation can be suppressed and the amount of reduction can be reduced, it is desirable to avoid contact with an oxidizing atmosphere (for example, the atmosphere) between the first heat treatment step S4 and the second heat treatment step S5 performed before the pressure sintering step S6 or between the second heat treatment step S5 and the pressure sintering step S6. In addition, it is desirable to perform the pressure sintering step S6 while avoiding contact with an oxidizing atmosphere (for example, the atmosphere) even after the second heat treatment step S5. Preferably, the second heat treatment step S5 and the pressure sintering step S6 are performed using a furnace capable of keeping airtightness. Hereinafter, description is provided for these steps in order.

(Weighing Step S1)

The weighing step S1 is a step of weighing a raw material containing Yb, a raw material containing Co, and a raw material containing Sb. These raw materials can be weighed using a general weighing machine. The raw materials may have any form. Specifically, the raw materials may be, for example, ore, scrap material or the like, or a high-purity refined product that has been refined in advance. Here, preferably, Yb, Co, and Sb are weighed such that the content ratios of them contained in the raw materials are analyzed in advance, and based on the analysis, the composition formula of the raw material after weighing is set to $Yb_xCo_4Sb_{12}$ (where x is more than 0 and 0.3 or less).

In addition, preferably, the weighing is performed with a hermetic working device such as a glove box that enables work under the condition of being shut from the outside air. As the hermetic working device, it is preferable to use one that can supply an inert gas such as nitrogen or argon to the inside. The weighing is preferably performed in a hermetic working device having an oxygen concentration of 0.1 to 100 volume ppm. The raw materials weighed in the hermetic working device are preferably placed in a heat-resistant container such as a graphite crucible. In addition, preferably, the raw materials weighed in the hermetic working device are placed in a quartz container or the like and vacuum-sealed.

Although any one of these embodiments can prevent excessive (unnecessary) oxidation of the raw materials, it is preferable to perform all of them. Note that, although excessive oxidation is unpreferable, the present embodiment oxidizes only the surface of the ribbon to a slight degree, and then performs heat treatment in the second heat treatment step S5 to reduce part of the Yb oxide of the crystals 13 precipitated in the intergranular layer 12, as described later. Thereby, the electrical resistance can be reduced.

(Mixing Step S2)

The mixing step S2 is a step of meltingly mixing the raw materials described above. The raw materials are melted at, for example, 1020° C. or higher, and preferably 1050° C. or higher. Note that, from the viewpoint of cost and maintenance of the heating device, the raw materials are melted at 1300° C. or lower, and more preferably 1,100° C. or lower.

Preferably, raw materials are melted while kept at the above temperature for several hours to several tens of hours and then rapidly cooled. For example, preferably, the raw materials are melted at the above temperature for 20 hours and then placed in water cooled to 20° C. or lower for rapidly cooling. Note that, if the amount of raw materials is large, slow cooling may be used. After the rapidly cooling, it is preferable to remove an ingot from the quartz container in an inert atmosphere and load it into a heat-resistant container such as a graphite crucible. Note that the ingot can be taken out in the air and loaded into the heat-resistant container for a short period of time of 1 hour or less. Then, for example, the temperature is raised to 1,100° C. in a high-frequency heating furnace and reheated to form a melt.

(Ribbon Preparation Step S3)

The ribbon preparation step S3 is a step of preparing a ribbon by rapidly cooling and solidifying the melt of the above-described raw materials by using the rapid liquid quench method. The rapid liquid quench method is a method in which a molten metal (melt) is dripped on a rotating metal roll and cooled more rapidly than the nucleation rate of crystals to produce an amorphous metal ribbon.

The thickness of the ribbon obtained in the ribbon preparation step S3 is preferably 10 to 200 μm. When the thickness of the ribbon is within this range, the uniformity of the structure becomes high and the degree of oxidation is easy to control. The ribbon preparation step S3 is also performed in an inert atmosphere as described above.

(First Heat Treatment Step S4)

The first heat treatment step S4 is a step including a step of heat-treating the prepared ribbon in an inert atmosphere with an adjusted oxygen concentration (not shown in FIG. 6) and a crushing step (not shown in FIG. 6), thereby obtaining polycrystalline grains 11 as crushed grains. That is, the first heat treatment step S4 may heat-treat the ribbon in an inert atmosphere with an adjusted oxygen concentration, and then crush the ribbon to obtain polycrystalline grains 11 as crushed powder. In addition, the first heat treatment step S4 may crush the above-mentioned ribbon to obtain polycrystalline grains 11 as crushed powder, and then heat-treat the polycrystalline grains 11 in an inert atmosphere with an adjusted oxygen concentration.

Prior to the heat treatment, preferably, a heat-resistant container such as a graphite crucible is reloaded and covered with a lid in a hermetic working device (oxygen concentration of 0.1 to 100 volume ppm). Note that, since the oxygen concentration in the heat-resistant container can be lowered, it is preferable to use a lid having a deep depth dimension for the heat-resistant container. The depth dimension of the lid of the heat-resistant container is preferably, for example, 5 to 10 cm. In addition, in order to lower the oxygen concentration in the heat-resistant container, it is preferable to load a getter material such as metal Ti.

The oxygen concentration in the inert atmosphere in the first heat treatment step S4 is, for example, preferably 10 volume ppm or less, and more preferably 5 volume ppm or less. In that case, only the surface of the ribbon can be slightly oxidized. In the present embodiment, although excessive oxidation is unpreferable, treatment in such an atmosphere makes it possible to slightly oxide only the surface of the ribbon or the surface of the polycrystalline grains 11. Then, by performing heat treatment in the later-performed second heat treatment step S5 to reduce part of the Yb oxide of the crystals 13 precipitated in the intergranular layer 12, it is possible to reduce the electrical resistance. In addition, in that case, the atomic ratio of O to Yb of the crystals 13 precipitated in the intergranular layer 12 can be made more than 0.4 and less than 1.5. For that reason, the electrical conductivity σ can be increased and the dimensionless figure of merit ZT can be increased while reducing the thermal conductivity κ of the thermoelectric conversion material 1.

Examples of the inert atmosphere include, but are not limited to, at least one atmosphere of nitrogen and argon. The oxygen concentration in the inert atmosphere can be adjusted by, for example, using a mixed gas of hydrogen and argon, a mixed gas of hydrogen and nitrogen, or hydrogen alone. Not that the inert atmosphere may contain water vapor. If water vapor is contained, oxidation is promoted a little.

As the heat treatment condition of the first heat treatment step S4, for example, the heat treatment temperature can be set to 500 to 800° C. In addition, the heat treatment condition of the first heat treatment step S4 can be 3 hours or more and less than 168 hours if the heat treatment temperature is 700° C., for example. The heat treatment time is preferably 48 hours or less from the viewpoint of preventing extreme oxidation of the ribbon or polycrystalline grains 11.

The crushing of the ribbon is preferably performed in a hermetic working device (oxygen concentration of 0.1 to 100 ppm). The polycrystalline grains 11 obtained by crushing have a median diameter (d50) of preferably 10 to 100 μm. In that case, it becomes easy to control the oxygen concentration by contact with oxygen, and it becomes easy to obtain a dense sintered body by the pressure sintering described later.

The crushing of the ribbon can be performed by using, for example, a mortar and a pestle, a ball mill, a rod mill, a high-pressure crushing roll, a vertical axis impactor mill, a jet mill, or the like.

The polycrystalline grains 11 obtained in the first heat treatment step S4 are weighed in a hermetic working device, then loaded in a carbon mold (carbon die) in a draft, and introduced into a pressure sintering device such as a hot press machine.

(Second Heat Treatment Step S5)

The second heat treatment step S5 is a step of subjecting the polycrystalline grains 11, heat-treated in the first heat treatment step S4, to heat treatment in a reducing atmosphere. Performing this second heat treatment step S5 reduces part of the Yb oxide of the crystals 13 precipitated in the intergranular layer 12. When this step is performed and then the later-described pressure sintering step S6 is performed, the atomic ratio of O to Yb of the crystals 13 precipitated in the intergranular layer 12 can finally be made more than 0.4 and less than 1.5. In the present embodiment, when the second heat treatment step S5 is performed, the atomic ratio of O to Yb of the crystals 13 precipitated in the intergranular layer 12 can be set within the above range. Therefore, the ratio of the metal Yb can be increased while including the oxide of Yb. The reason for this is not exactly clear, but is, as described above, presumably because oxygen is removed from the bond of Yb oxide, such as $Yb_2O_3$ for example, which has a low electrical conductivity $\sigma$ and a low thermal conductivity $\kappa$ and is extremely stable, so that a stable oxide having oxygen defects is generated. Moreover, it is considered that this Yb oxide having defects needs to generate electrons in order to secure electrical neutrality, and therefore the electrical conductivity is inevitably high. Therefore, it is considered that the electrical conductivity $\sigma$ can be increased while reducing the thermal conductivity $\kappa$ of the thermoelectric conversion material 1 heat-treated in the second heat treatment step S5, which as a result increases the dimensionless figure of merit ZT. To put it differently, it can be said that the second heat treatment step S5 is a step of, immediately before sintering the crystalline Yb suboxide generated on the surface of the polycrystalline grains 11 in the first heat treatment step S4, heat-treating part or all thereof to the extent that conduction electrons are generated in order to maintain electrical neutrality.

Examples of the reducing atmosphere in the second heat treatment step S5 include a hydrogen concentration of 3% by volume or 100% by volume. This second heat treatment step S5 is also preferably performed in a hermetic working device (oxygen concentration of 0.1 to 100 ppm).

The second heat treatment step S5 is preferably performed with a pressure sintering device which performs pressure sintering. In that case, the second heat treatment step S5 and the pressure sintering step S6 can be continuously performed in the same furnace. For this reason, it is possible to suppress the oxidation reaction of the polycrystalline grains 11 heat-treated in the second heat treatment step S5. In the present embodiment, preferably, an atmosphere in the pressure sintering device is evacuated to a pressure of, for example, about 10 Pa and is then replaced with an inert atmosphere. Note that the inert atmosphere may be, but is not limited to, at least one atmosphere of nitrogen and argon, for example. This operation is repeated twice or more, and after the final evacuation, the hydrogen concentration is set to preferably 3% by volume or 100% by volume as described above. Then, when the gas pressure in the pressure sintering device becomes 0.1 to 0.6 MPa in gauge pressure (1 to 6 atm), heat treatment is performed at about 400 to 600° C. for 1 to 6 hours, followed by cooling.

(Pressure Sintering Step S6)

The pressure sintering step S6 is a step of manufacturing the above-described thermoelectric conversion material 1 according to the present embodiment by pressure-sintering the polycrystalline grains 11 heat-treated in the second heat treatment step S5 in an inert atmosphere. That is, the pressure sintering step S6 is a step of manufacturing the above-described thermoelectric conversion material 1 according to the present embodiment by pressure sintering while avoiding contact with an oxidizing atmosphere (for example, the atmosphere) after the second heat treatment step S5 and until the pressure sintering step S6 is finished. Note that inert means not being oxidizing. Such an inert atmosphere can be suitably achieved by discharging oxygen in the atmosphere from the furnace by, for example, evacuation to 10 Pa or less and replacement with an Ar gas three times.

In this pressure sintering step S6, it is preferable to replace the reducing atmosphere with an inert atmosphere before performing pressure sintering. For example, as described above, the reducing atmosphere in the pressure sintering device is evacuated to about 10 Pa and then replaced with an inert atmosphere. Here, it is preferable to operate the pressure sintering device without exposing it to the atmosphere. Examples of the inert atmosphere include, but are not limited to, at least one atmosphere of nitrogen and argon. Note that the inert atmosphere is preferably an argon atmosphere. In addition, when the reducing atmosphere is replaced with an inert atmosphere, the above-described replacement operation is performed preferably twice or more, and more preferably three times or more. As the pressure sintering device, for example, a hot press machine can be used. Note that, in this step, it is also possible to perform exposure to the atmosphere for a short period of time of about 2 hours before evacuation.

After the replacement with an inert atmosphere, the inside of the pressure sintering device is heated at a rate of temperature rise of 300 to 600° C./h and kept at 600 to 800° C. for 1 hour. Here, pressure is applied at a rate equivalent to the rate of temperature rise so that the pressure applied at the keep temperature is, for example, 50 to 70 MPa, and specifically 68 MPa, for example. After the keeping is finished, the inside is cooled at a cooling rate of 500° C./h or less and depressurized. Note that, preferably, the cooling is performed by spontaneous cooling in a pressure sintering device. The operations up to this point make it possible to suitably manufacture the above-described thermoelectric conversion material 1 according to the present embodiment.

(Post-Treatment)

The thermoelectric conversion material 1 manufactured from the pressure sintering device is taken out together with the carbon mold, and the thermoelectric conversion material 1 (sintered body) is taken out of the heat-resistant container. The debris on the surface of the thermoelectric conversion material 1 is removed, which is cut into a desired size and shape with a precision processing machine. These operations can be performed in the air. It is preferable to use a precision processing machine equipped with a diamond blade. In addition, if necessary, a conventional method can be used to measure the Seebeck coefficient, electrical conductivity, specific heat, thermal conductivity, and the like.

The method for manufacturing a thermoelectric conversion material according to the present embodiment described above performs the weighing step S1 to the pressure sintering step S6, as described above. Thus, it is possible to manufacture the thermoelectric conversion material 1 including a large number of polycrystalline grains 11 which include a skutterudite-type crystal structure containing Yb, Co, and Sb; and an intergranular layer 12 which is between the neighboring polycrystalline grains 11 and includes crystals 13 in which an atomic ratio of O to Yb is more than 0.4 and less than 1.5. The method for manufacturing a thermoelectric conversion material according to the present embodiment does not introduce in its manufacturing process an active material such as Ba, La, or Sr. Therefore, the method for manufacturing a thermoelectric conversion material according to the present embodiment can manufacture the thermoelectric conversion material having a high dimensionless figure of merit ZT and high reliability. Additionally, the method for manufacturing a thermoelectric conversion material according to the present embodiment performs the second heat treatment step S5 in order to set the atomic ratio of O to Yb of the crystals 13 contained in the intergranular layer 12 to more than 0.4 and less than 1.5. For this reason, it is possible to shorten the heat treat time (annealing time) in the first heat treatment step S4. Therefore, the method for manufacturing a thermoelectric conversion material according to the present embodiment is superior in mass productivity to the conventional method.

EXAMPLES

Next, description is provided in more detail for the thermoelectric conversion material, the thermoelectric conversion module, and the method for manufacturing a thermoelectric conversion material according to the present invention using Examples with the effects of the present invention and Comparative Examples without them.

(Manufacture of Sample Nos. 1 to 9 According to Comparative Examples)

Sample Nos. 1 to 9 according to Comparative Examples were manufactured as follows.

[1] (Weighing, Mixing, and Preparing Ribbon)

The raw materials Sb, Co, and Yb were prepared and weighed in a glove box having an oxygen concentration of 0.1 to 100 ppm or less to satisfy $Yb_{0.2-0.3}Co_4Sb_{12}$. The weighed raw materials were loaded into a graphite crucible and placed into a quartz tube, and then the quartz tube was vacuum-sealed to obtain an ampoule. The ampoule was heated to a temperature of 1080° C., kept for 20 hours, then placed into water cooled to 20° C. or lower, and rapidly cooled. An ingot was taken out of the ampoule after rapidly cooling in an inert atmosphere and loaded into a graphite crucible for rapidly cooling. Then, the temperature was raised to 1,100° C. in a high-frequency heating furnace, followed by remelting. The molten melt was dripped on a copper roll by using the rapid liquid quench method to prepare a rapidly cooled ribbon.

[2] (First Heat Treating)

The rapidly cooled ribbon was reloaded into the graphite crucible in the glove box and vacuum-sealed in an ampoule. The ampoule was heat-treated in an annealing furnace at 700° C. for 3 to 168 hours as shown in Table 1. Table 1 shows the atmosphere in the furnace, the oxygen concentration, the shape of the graphite crucible used in the annealing furnace, and the shape of its lid. Then, the rapidly cooled ribbon, heat-treated, was taken out of the glove box, and crushed with a mortar and pestle to produce crushed powder (polycrystalline grains) having a d50 of 10 to 100 µm. The obtained polycrystalline grains were weighed in a glove box, then loaded into a carbon mold (carbon die) in a draft, and introduced into a hot press machine.

[3] (Pressure Sintering)

The temperature was raised at a rate of temperature rise of 300 to 600° C./h with a hot press machine, and kept at 700 to 750° C. for 1 hour. Here, pressure was applied at a rate equivalent to the rate of temperature rise so that the press pressure (pressurizing pressure) was 68 MPa at the keep temperature. The temperature was raised with a hot press machine at 600° C./h when the keep temperature was low (700° C.) and at 300° C./h when the keep temperature was high (750° C.) After the keeping was finished, cooling was performed at about 500° C./h to carry out depressurization.

[4] (Post-Treatment)

The carbon mold was taken out of the hot press machine, and the sintered body was taken out in the air. After the debris on the surface of the sintered body was removed, a 3 mm square×10 mm long rectangular parallelepiped was cut out with a precision processing machine using a diamond blade, and the Seebeck coefficient and electrical conductivity were measured. In addition, a small piece of 2 to 3 mm square×2 mm thickness and a square plate of 10 mm square×1 mm thickness were cut out from the same sintered body, and their specific heat and thermal diffusivity were measured to calculate the thermal conductivity.

[5] (Analysis)

(Measurement of Oxygen Concentration)

The oxygen concentration of the sintered body was measured with a molten oxygen concentration analyzer (EMGA-920 manufactured by HORIBA, Ltd.).

(Analysis of Composition)

The composition was analyzed with an ICP inductively coupled plasma analyzer (ICPS-8100 manufactured by Shimadzu Corporation).

(Identification of Structure and Crystal Structure)

The structure and crystal structure were identified using a combination of scanning electron microscope (SEM) (S-2300 manufactured by Hitachi, Ltd.), transmission electron microscope (TEM) (HF-2100 manufactured by Hitachi High-Technologies Corporation), and X-ray diffractometer (D8 Advance manufactured by Bruker AXS). Note that the measurement by SEM and TEM was performed by measuring between any two points for which the distance between the neighboring polycrystalline grains was shortest when observing an area including the intergranular layer.

(Analysis of Structure)

The structure was analyzed with an electron beam microanalyzer (EPMA 1610 manufactured by Shimadzu Corporation). Note that the measurement conditions of the electron beam microanalyzer were such that the acceleration voltage was 15 kV, the current was 100 nA, and the beam diameter was 10 µm, and then the average value of 5 points was obtained.

(Observation of Resistance Distribution)

The resistance distribution was observed with a scanning probe microscope (NanoScope IVa AFM manufactured by Digital Instruments, Bruker AXS). Note that the scanning probe microscope was used for simultaneous measurement of contact mode and spreading resistance. A diamond-coated silicon cantilever was employed as the probe of the scanning probe microscope. Across section of the sample was prepared by mechanical polishing, and each layer of the device was short-circuited so that a common bias voltage could be applied. The measurement was performed at room temperature in the atmosphere.

(Performance of Thermoelectric Conversion Material)

The Seebeck coefficient and electrical conductivity were measured with ZEM-3 manufactured by ADVANCE RIKO, Inc. The Seebeck coefficient and the electrical conductivity were measured under the standard measurement conditions recommended by the device manufacturer. The sample was processed into a shape having two end surfaces, and regarding the Seebeck coefficient, the end surfaces of the sample were heated with a differential temperature heater to make a temperature difference between both ends of the sample, and measurement was performed on the temperature difference and electromotive force between the probe thermocouples pressed against the side surfaces of the sample. The electrical resistance was measured by the DC four-terminal method.

The thermal conductivity was calculated from the specific heat, the thermal diffusivity, and the density. The specific heat was measured with an input compensation type differential scanning calorimeter Pyris 1 manufactured by Perkin-Elmer, the thermal diffusivity was measured with LFA 467 manufactured by NETZSCH, which performs the laser flash method, and the density was measured with the Archimedes method.

The dimensionless figure of merit ZT was calculated from the above-mentioned formula (1) using the Seebeck coefficient, the thermal conductivity, and the electrical conductivity obtained by the measurement.

(Manufacture of Sample Nos. 10 to 34 According to Examples)

Sample Nos. 10 to 34 according to Examples were manufactured in the same manner as Comparative Examples except that the above [2] and [3] were changed to the following [2A] and [3A], respectively.

[2A] (First Heat Treatment Step S4)

The rapidly cooled ribbon was reloaded into the graphite crucible in the glove box and set in the annealing furnace as it was (without being vacuum-sealed in the ampoule). For the purpose of reducing the oxygen concentration in the graphite crucible, the used lid of the graphite crucible had a deep depth dimension (depth of 12 cm), as shown in Table 1. Moreover, as shown in Table 1, there was also one in which a getter material (metal Ti) was loaded inside a graphite crucible.

The rapidly cooled ribbon reloaded in the graphite crucible was heat-treated at 700° C. for 3 to 48 hours, as shown in Table 1. Table 1 shows the atmosphere in the furnace for heat treatment, the oxygen concentration, the shape of the graphite crucible used in the annealing furnace, and the shape of its lid. Then, the rapidly cooled ribbon, heat-treated, was taken out of the glove box, and crushed with a mortar and pestle to produce crushed powder (polycrystalline grains) having a d50 of 10 to 100 μm. The obtained polycrystalline grains were weighed in a glove box, then loaded into a carbon mold in a draft, and introduced into a hot press machine.

[3A] (Second Heat Treatment Step S5 and Pressure Sintering Step S6)

An atmosphere in the hot press machine was evacuated to 10 Pa and replaced with an Ar gas. This was repeated twice or more, and after the final evacuation, 3% by volume or 100% by volume of hydrogen was introduced, as shown in Table 1. Then, after the gas pressure in the hot press machine became 0.1 to 0.6 MPa in gauge pressure (1 to 6 atm), heat treatment was performed at 400 to 600° C. for 1 to 6 hours, as shown in Table 1. Here, no press pressure (pressurizing pressure) was applied.

After cooling, the hot press machine was evacuated again to 10 Pa or less without exposure to the atmosphere, and an Ar gas was introduced (0 MPa in gauge pressure (in this case, the numerical value representing the pressure is not shown in Table 1)). In addition, when this Ar gas was introduced, pressure was applied at 0.1 MPa or 0.6 MPa in gauge pressure in some cases, as shown in Table 1.

After the replacement with an Ar gas was completed, the temperature was raised again at a rate of temperature rise of 300 to 600° C./h, and was kept at 750° C. for 1 hour, as shown in Table 1. Here, pressure was applied at a rate equivalent to the rate of temperature rise so that the press pressure (pressurizing pressure) was 68 MPa at a keep temperature of 750° C. After the keeping was finished, cooling was performed at about 500° C./h to carry out depressurization.

Then, [4] and [5] were performed in the same manner as Comparative Examples.

Table 1 shows the time (h) of heat treatment, the atmosphere during the heat treatment, the $O_2$ concentration (volume ppm) during the heat treatment, the shape of the graphite crucible during the heat treatment, the atmosphere of pressure sintering pretreatment, the temperature (° C.) of pressure sintering pretreatment, the time (h) of pressure sintering pretreatment, and the pressure sintering temperature (° C.) for sample Nos. 1 to 34. Note that, in Table 1, the blank entries indicate that the measurement was impossible because of vacuum, and "-" indicates that the measurement was not performed. The "%" In "atmosphere of pressure sintering pretreatment" indicates "volume %."

In addition, Table 2 shows the oxygen concentration (volume ppm), the Seebeck coefficient S (absolute value) ($\times 10^2$ μV/K), the thermal conductivity (W/mK), the electrical conductivity (S/m), and the dimensionless figure of merit ZT (at 500° C.) for the sintered bodies of sample Nos. 1 to 34.

TABLE 1

| | First Heat Treatment Step S4 | | | | Second Heat Treatment Step S5 | | | |
|---|---|---|---|---|---|---|---|---|
| No. | Heat Treatment Time (h) | Atmosphere During Heat Treatment | $O_2$ Concentration During Heat Treatment (Volume ppm) | Shape of Graphite Crucible During Heat Treatment | Atmosphere of Pressure Sintering Pretreatment | Temperature of Pressure Sintering Pretreatment (° C.) | Time of Pressure Sintering Pretreatment (h) | Temperature of Pressure Sintering (° C.) |
| 1 | 168 | Vacuum | | Φ10 mm × 30 mml | — | — | — | 700 |
| 2 | 168 | Argon | 3 | Φ10 mm × 30 mml | — | — | — | 700 |
| 3 | 168 | Nitrogen | 3 | Φ10 mm × 30 mml | — | — | — | 700 |
| 4 | 48 | Vacuum | | Φ10 mm × 30 mml | — | — | — | 700 |
| 5 | 24 | Vacuum | | Φ10 mm × 30 mml | — | — | — | 700 |
| 6 | 3 | Vacuum | | Φ10 mm × 30 mml | — | — | — | 700 |
| 7 | 168 | Argon | 3 | Φ10 mm × 30 mml | — | — | — | 700 |
| 8 | 48 | Argon | 3 | Φ100 mm × 100 mml Deep Crucible Lid | — | — | — | 750 |
| 9 | 3 | Argon | 3 | Φ100 mm × 100 mml Deep Crucible Lid | — | — | — | 750 |
| 10 | 48 | Argon | 3 | Φ100 mm × 100 mml Deep Crucible Lid | 3% Hydrogen → Argon | 600 | 2 | 750 |

TABLE 1-continued

| | First Heat Treatment Step S4 | | | | Second Heat Treatment Step S5 | | | |
|---|---|---|---|---|---|---|---|---|
| No. | Heat Treatment Time (h) | Atmosphere During Heat Treatment | $O_2$ Concentration During Heat Treatment (Volume ppm) | Shape of Graphite Crucible During Heat Treatment | Atmosphere of Pressure Sintering Pretreatment | Temperature of Pressure Sintering Pretreatment (° C.) | Time of Pressure Sintering Pretreatment (h) | Temperature of Pressure Sintering (° C.) |
| 11 | 24 | Argon | 3 | Φ100 mm × 100 mml Deep Crucible Lid | 3% Hydrogen → Argon | 600 | 2 | 750 |
| 12 | 3 | Argon | 3 | Φ100 mm × 100 mml Deep Crucible Lid | 3% Hydrogen → Argon | 600 | 2 | 750 |
| 13 | 48 | Argon | 3 | Φ100 mm × 100 mml Deep Crucible Lid | 100% Hydrogen → Argon | 600 | 2 | 750 |
| 14 | 24 | Argon | 3 | Φ100 mm × 100 mml Deep Crucible Lid | 100% Hydrogen → Argon | 600 | 2 | 750 |
| 15 | 3 | Argon | 3 | Φ100 mm × 100 mml Deep Crucible Lid | 100% Hydrogen → Argon | 600 | 2 | 750 |
| 16 | 48 | Nitrogen | 3 | Φ100 mm × 100 mml Deep Crucible Lid | 3% Hydrogen → Argon | 600 | 2 | 750 |
| 17 | 24 | Nitrogen | 3 | Φ100 mm × 100 mml Deep Crucible Lid | 3% Hydrogen → Argon | 600 | 2 | 750 |
| 18 | 3 | Nitrogen | 3 | Φ100 mm × 100 mml Deep Crucible Lid | 3% Hydrogen → Argon | 600 | 2 | 750 |
| 19 | 48 | Nitrogen | 3 | Φ100 mm × 100 mml Deep Crucible Lid | 100% Hydrogen → Argon | 600 | 2 | 750 |
| 20 | 24 | Nitrogen | 3 | Φ100 mm × 100 mml Deep Crucible Lid | 100% Hydrogen → Argon | 600 | 2 | 750 |
| 21 | 3 | Nitrogen | 3 | Φ100 mm × 100 mml Deep Crucible Lid | 100% Hydrogen → Argon | 600 | 2 | 750 |
| 22 | 24 | Nitrogen | 3 | Φ100 mm × 100 mml Deep Crucible Lid | 3% Hydrogen → Argon | 400 | 2 | 750 |
| 23 | 24 | Nitrogen | 3 | Φ100 mm × 100 mml Deep Crucible Lid | 100% Hydrogen → Argon | 400 | 2 | 750 |
| 24 | 24 | Nitrogen | 3 | Φ100 mm × 100 mml Deep Crucible Lid | 3% Hydrogen → Argon | 500 | 2 | 750 |
| 25 | 24 | Nitrogen | 3 | Φ100 mm × 100 mml Deep Crucible Lid | 100% Hydrogen → Argon | 500 | 2 | 750 |
| 26 | 24 | Nitrogen | 3 | Φ100 mm × 100 mml Deep Crucible Lid | 3% Hydrogen → Argon | 600 | 1 | 750 |
| 27 | 24 | Nitrogen | 3 | Φ100 mm × 100 mml Deep Crucible Lid | 3% Hydrogen → Argon | 600 | 4 | 750 |
| 28 | 24 | Nitrogen | 3 | Φ100 mm × 100 mml Deep Crucible Lid | 3% Hydrogen → Argon | 600 | 6 | 750 |
| 29 | 24 | Argon | 3 | Φ100 mm × 100 mml Deep Crucible Lid | 3% Hydrogen → Argon 0.1 MPa Pressurization | 600 | 2 | 750 |
| 30 | 24 | Nitrogen | 3 | Φ100 mm × 100 mml Deep Crucible Lid | 3% Hydrogen → Argon 0.1 MPa Pressurization | 600 | 2 | 750 |
| 31 | 24 | Argon | 3 | Φ100 mm × 100 mml Deep Crucible Lid | 3% Hydrogen → Argon 0.6 MPa Pressurization | 600 | 2 | 750 |
| 32 | 48 | Argon | 3 | Φ100 mm × 100 mml Deep Crucible Lid + Ti Getter Material | 100% Hydrogen → Argon | 600 | 2 | 750 |
| 33 | 24 | Argon | 3 | Φ100 mm × 100 mml Deep Crucible Lid + Ti Getter Material | 100% Hydrogen → Argon | 600 | 2 | 750 |
| 34 | 3 | Argon | 3 | Φ100 mm × 100 mml Deep Crucible Lid + Ti Getter Material | 100% Hydrogen → Argon | 600 | 2 | 750 |

TABLE 2

| No. | Oxygen Concentration of Sintered Body (Volume ppm) | Seebeck Coefficient (Absolute Value) (×10² μV/K) | Thermal Conductivity (W/mK) | Electrical Conductivity (S/m) | Dimensionless Figure of Merit ZT (at 500° C.) |
|---|---|---|---|---|---|
| 1 | 400 | 1.67 | 3.78 | 0.00174 | 0.99 |
| 2 | 420 | 1.63 | 3.88 | 0.00185 | 0.98 |
| 3 | 1250 | 2.24 | 3.38 | 0.00070 | 0.80 |
| 4 | 480 | 1.67 | 3.78 | 0.00174 | 0.99 |
| 5 | 410 | 1.67 | 3.86 | 0.00184 | 1.03 |
| 6 | 320 | 1.68 | 3.90 | 0.00175 | 0.98 |
| 7 | 1850 | 1.76 | 3.24 | 0.00088 | 0.65 |
| 8 | 440 | 1.77 | 3.66 | 0.00154 | 1.02 |
| 9 | 410 | 1.72 | 3.75 | 0.00166 | 1.01 |
| 10 | 440 | 1.69 | 3.83 | 0.00196 | 1.13 |

TABLE 2-continued

| No. | Oxygen Concentration of Sintered Body (Volume ppm) | Seebeck Coefficient (Absolute Value) ($\times 10^2$ µV/K) | Thermal Conductivity (W/mK) | Electrical Conductivity (S/m) | Dimensionless Figure of Merit ZT (at 500° C.) |
|---|---|---|---|---|---|
| 11 | 440 | 1.68 | 3.84 | 0.00192 | 1.09 |
| 12 | 390 | 1.65 | 3.78 | 0.00198 | 1.10 |
| 13 | 430 | 1.78 | 3.78 | 0.00171 | 1.11 |
| 14 | 440 | 1.76 | 3.78 | 0.00180 | 1.14 |
| 15 | 460 | 1.76 | 3.77 | 0.00176 | 1.12 |
| 16 | 510 | 1.78 | 3.69 | 0.00179 | 1.19 |
| 17 | 500 | 1.78 | 3.76 | 0.00184 | 1.20 |
| 18 | 480 | 1.77 | 3.71 | 0.00181 | 1.18 |
| 19 | 480 | 1.78 | 3.80 | 0.00185 | 1.19 |
| 20 | 470 | 1.79 | 3.80 | 0.00184 | 1.20 |
| 21 | 450 | 1.78 | 3.83 | 0.00184 | 1.18 |
| 22 | 480 | 1.77 | 3.66 | 0.00162 | 1.07 |
| 23 | 440 | 1.77 | 3.68 | 0.00160 | 1.05 |
| 24 | 470 | 1.77 | 3.67 | 0.00165 | 1.09 |
| 25 | 430 | 1.77 | 3.68 | 0.00163 | 1.07 |
| 26 | 510 | 1.76 | 3.77 | 0.00176 | 1.12 |
| 27 | 490 | 1.78 | 3.82 | 0.00175 | 1.12 |
| 28 | 470 | 1.78 | 3.82 | 0.00178 | 1.14 |
| 29 | 470 | 1.77 | 3.79 | 0.00182 | 1.16 |
| 30 | 500 | 1.79 | 3.81 | 0.00180 | 1.17 |
| 31 | 430 | 1.76 | 3.83 | 0.00189 | 1.18 |
| 32 | 430 | 1.70 | 3.78 | 0.00189 | 1.12 |
| 33 | 430 | 1.73 | 3.78 | 0.00189 | 1.16 |
| 34 | 440 | 1.78 | 3.78 | 0.00181 | 1.17 |

As shown in Table 1, sample Nos. 1 to 9 being Comparative Examples were not subjected to the pressure sintering pretreatment (second heat treatment step S5) in the operation [3], and were not subjected to Ar gas replacement or the like in the pressure sintering. Therefore, these samples produced a poor result that the dimensionless figure of merit ZT was less than 1.05, as shown in Table 2. Note that, in sample No. 7 being a Comparative Example, it is possible that the air in the graphite crucible was not successfully replaced with argon, which presumably resulted in a significantly high oxygen concentration in the sintered body.

On the other hand, sample Nos. 10 to 34 being Examples were subjected to pressure sintering pretreatment (second heat treatment step S5) in the operation [3A], and were subjected to Ar gas replacement or the like in the pressure sintering step S6 (see Table 1). Therefore, these samples produced a good result that the dimensionless figure of merit ZT was 1.05 or more, as shown in Table 2.

In sample Nos. 10 to 34 according to Examples, the dimensionless figure of merit ZT had a good result. From this, it is possible to achieve a high dimensionless figure of merit ZT (good efficiency of thermoelectric conversion) in the case of preparing a thermoelectric conversion module having a plurality of elements in each of which these samples including a skutterudite-type crystal structure and samples having a phase opposite to these phase are connected via a conductive material.

FIG. 7A to FIG. 7E shows an EPMA image of sample No. 10 being an Example. In FIG. 7A is an EPMA image, and FIG. 7B to FIG. 7E are diagrams showing the results of elemental mapping performed on Yb, Co, Sb, and O, respectively.

FIG. 8A to FIG. 8E shows an EPMA image of sample No. 16 being an Example. In FIG. 8A is an EPMA image, and FIG. 8B to FIG. 8E are diagrams showing the results of elemental mapping performed on Yb, Co, Sb, and O, respectively.

Figures 9A, 9B, 9C, 9D, 9E:
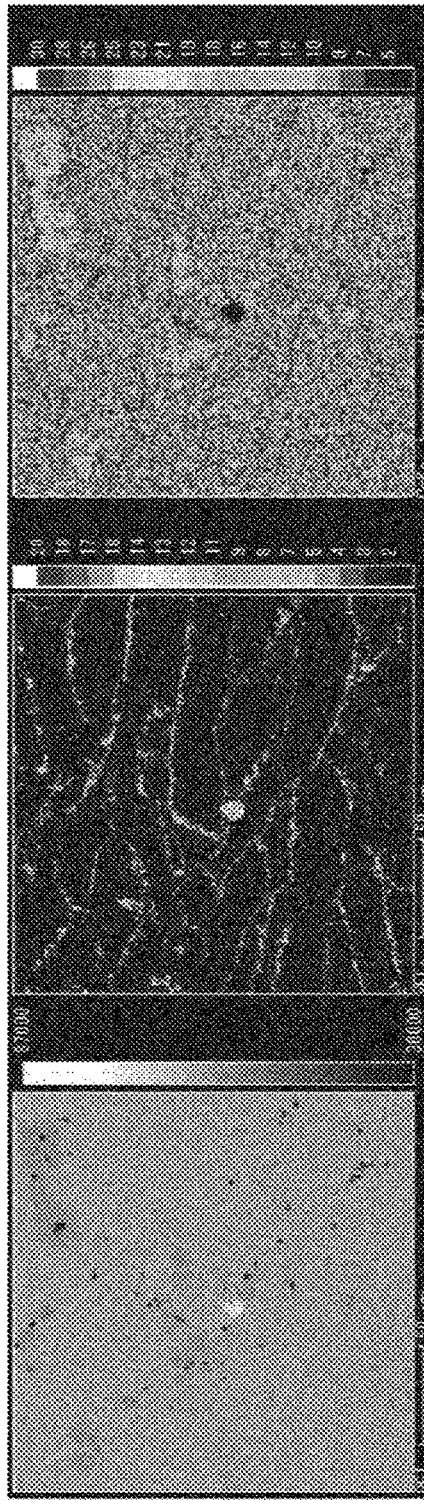
FIGS. 9A to 9E shows an EPMA image of sample No. 3 being a Comparative Example.

FIG. 9A to FIG. 9e shows an EPMA image of sample No. 3 being a Comparative Example. In FIG. 9A is an EPMA image, and FIG. 9B to FIG. 9E are diagrams showing the results of elemental mapping performed on Yb, Co, Sb, and O, respectively.

As shown in FIG. 9A to FIG. 9E, in Comparative Examples, Yb and Sb are distributed at a high concentration on the outer edge of each polycrystalline grain, and the outline can be clearly confirmed.

On the other hand, as shown in FIGS. 7A-E to 8A-E, in Examples, Yb and Sb are uniformly distributed inside the polycrystalline grains, and the outline cannot be clearly confirmed. Such a state in Examples was obtained by performing a predetermined heat treatment (first heat treatment step S4 and second heat treatment step S5) before pressure sintering. Note that the shapes of few individual polycrystalline grains in Examples can be clearly confirmed because Yb and the like are uniformly distributed in FIGS. 7A-E to 8A-E. However, since it is common that the polycrystalline grains were pressure-sintered, it is considered that the shape and distribution are similar to those of Comparative Examples.

In addition, as shown in FIGS. 7A-E to 9A-E, the shapes of the individual polycrystalline grains are elongated and oriented in substantially parallel directions. This is considered to have been obtained by pressure sintering. Plus, since the shapes of the polycrystalline grains are elongated as described above, it is considered that the electrical conductivity and thermal conductivity have anisotropy.

Figure 10C:
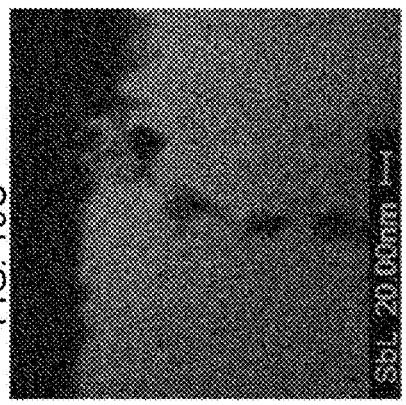
FIGS. 10A to 10E shows a diagram showing a transmission electron microscope (TEM) photograph of sample No. 10 being an Example and the results of elemental mapping.
Figure 10E:
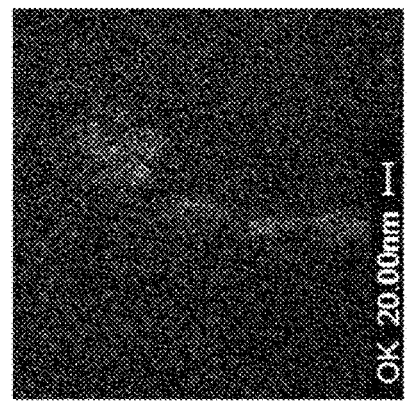
Figure 10B:
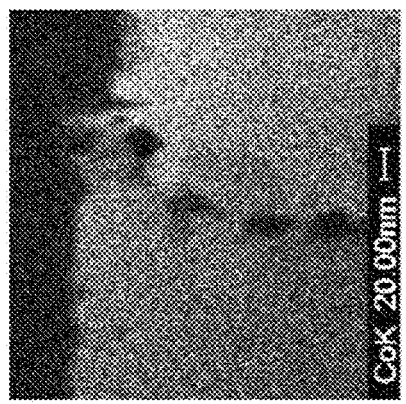
Figure 10D:
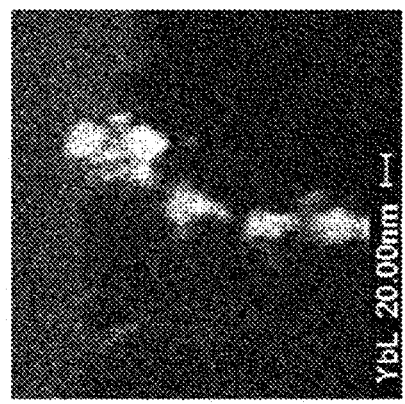
Figure 10A:
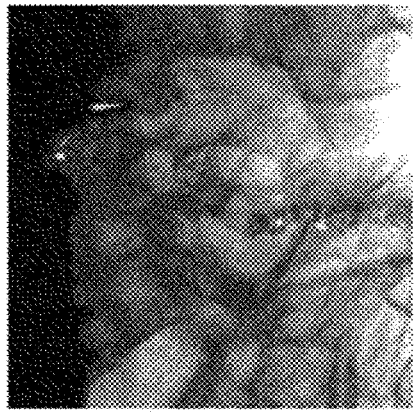

FIG. 10A to FIG. 10E shows a diagram showing a transmission electron microscope (TEM) photograph of sample No. 10 being an Example and the results of elemental mapping. In FIG. 10A is a TEM photograph of sample No. 10, and FIGS. 10B to 10E are diagrams showing the results of elemental mapping performed on Co, Sb, Yb, and O, respectively. In FIGS. 10B to 10E, the white portions indicate that the concentration of the mapping target element is high, and the black portions indicate that the concentration of the mapping target element is low.

As shown in FIGS. 10A to 10E, it was confirmed that, near the center of each photograph, an intergranular layer extended in one direction (vertical direction) from the surface of the thermoelectric conversion material, and it was confirmed that polycrystalline grains were present so as to sandwich the intergranular layer.

Plus, as shown in FIGS. 10B and 10C, it was confirmed that Co and Sb were distributed in the polycrystalline grains.

In addition, as shown in FIGS. 10D and 10E, it was confirmed that Yb and O were distributed (unevenly distributed) in the small crystals in the intergranular layer.

Figures 11A, 11B:
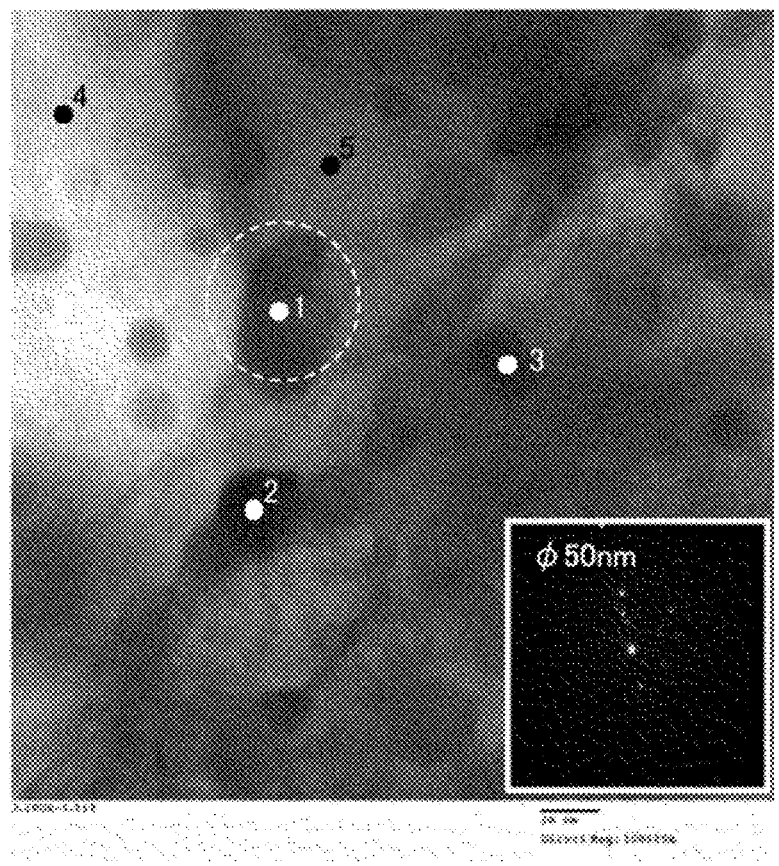
FIG. 11A is a diagram showing a TEM photograph of sample No. 29 being an Example, and an electron beam diffraction pattern of a portion surrounded by a dotted circle in the figure. The scale bar at the lower right of FIG. 11A shows 20 nm.
FIG. 11B is a table showing EDX analysis values (at %) at positions 1 to 5 in FIG. 11A.

FIG. 11A is a diagram showing a TEM photograph of sample No. 29 being an Example, and an electron beam diffraction pattern of a portion surrounded by a dotted circle in the figure. In FIG. 11A, analysis was performed at positions 1 to 5 by an energy dispersive X-ray analyzer (EDX). The results are shown in the table of FIG. 11B.

As shown in FIGS. 11A and 11B, positions 1 to 3 were rich in Yb and O, and the atomic ratio of O to Yb was about 0.5. That is, positions 1 to 3 were $Yb_2O$. On the other hand, position 5 was a portion considered to be the main phase, and contained a large amount of Sb and Co. Specifically, position 5 was of a skutterudite-type crystal structure containing Yb, Co, and Sb (predetermined crystal grains). Note that, since the amount of Yb was slightly smaller than that at position 5, position 4 was considered to be a phase formed by removing Yb from the precipitated Yb phase (main phase) (that is, a Yb phase having Yb defects).

Figure 12A:
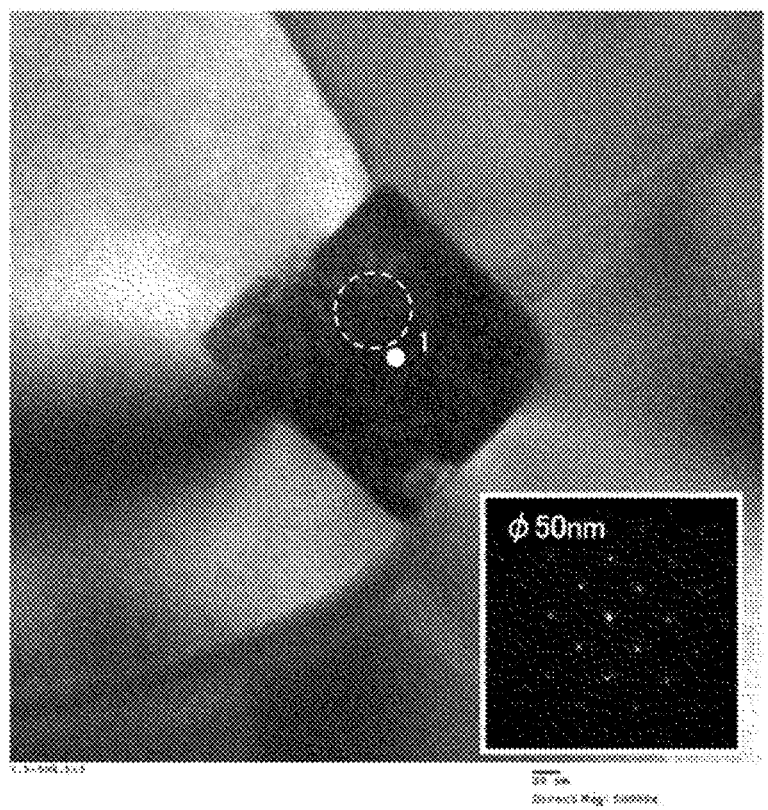
FIG. 12A is a diagram showing a TEM photograph of sample No. 7 being a Comparative Example, and an electron beam diffraction pattern of a portion surrounded by a dotted circle in the figure. The scale bar at the lower right of FIG. 12A shows 20 nm.
Figure 12B:
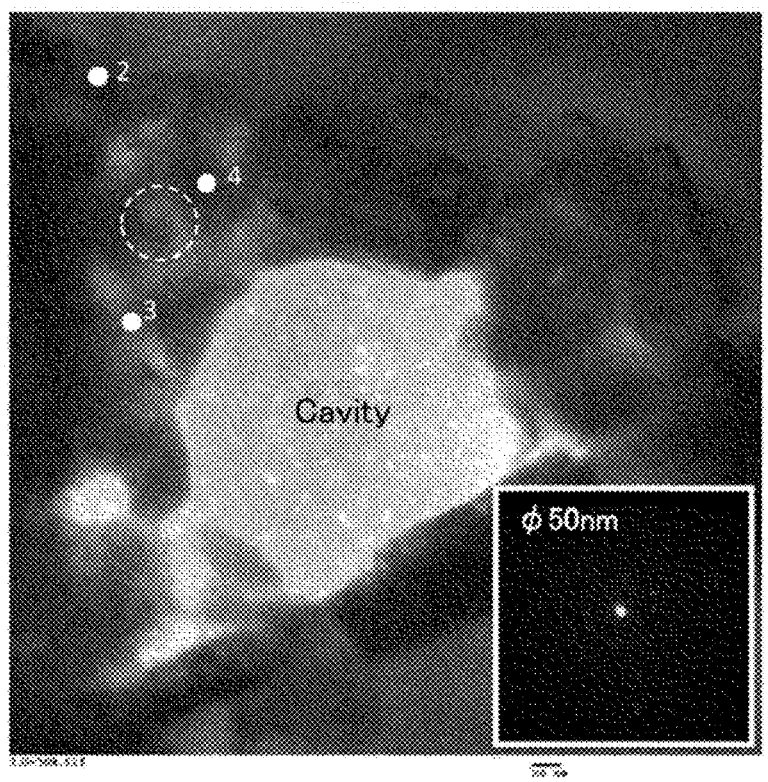
FIG. 12B is a diagram showing a TEM photograph of sample No. 7 being a Comparative Example, and an electron beam diffraction pattern of a portion surrounded by a dotted circle in the figure. The scale bar at the lower right of FIG. 12B shows 20 nm.

FIG. 12A is a diagram showing a TEM photograph of sample No. 7 being a Comparative Example, and an electron beam diffraction pattern of a portion surrounded by a dotted circle in the figure. FIG. 12B is a diagram showing a TEM photograph of sample No. 7 being a Comparative Example, and an electron beam diffraction pattern of a portion surrounded by a dotted circle in the figure. Analysis by EDX was performed at positions 1 to 4 in FIGS. 12A and 12B. The results are shown in the table of FIG. 12C.

As shown in FIGS. 12A to 12C, position 1 was rich in Yb, and the atomic ratio of O to Yb was about 0.1. Position 2 was a portion considered to be the main phase (predetermined crystal grains), and contained a large amount of Sb and Co. The positions 3 and 4 were rich in Yb and O, but the atomic ratio of O to Yb was 0.4 (rounded down to the first decimal place). That is, positions 3 and 4 were $Yb_{2.5}O$.

As can be seen by comparing FIG. 11A and the table shown in FIG. 11B with FIGS. 12A and 12B, and the table shown in FIG. 12C, when a predetermined heat treatment (first heat treatment step S4 and second heat treatment step S5) is performed before pressure sintering, the atomic ratio of O to Yb can be set to a predetermined range of more than 0.4 and less than 1.5.

Figure 13A:
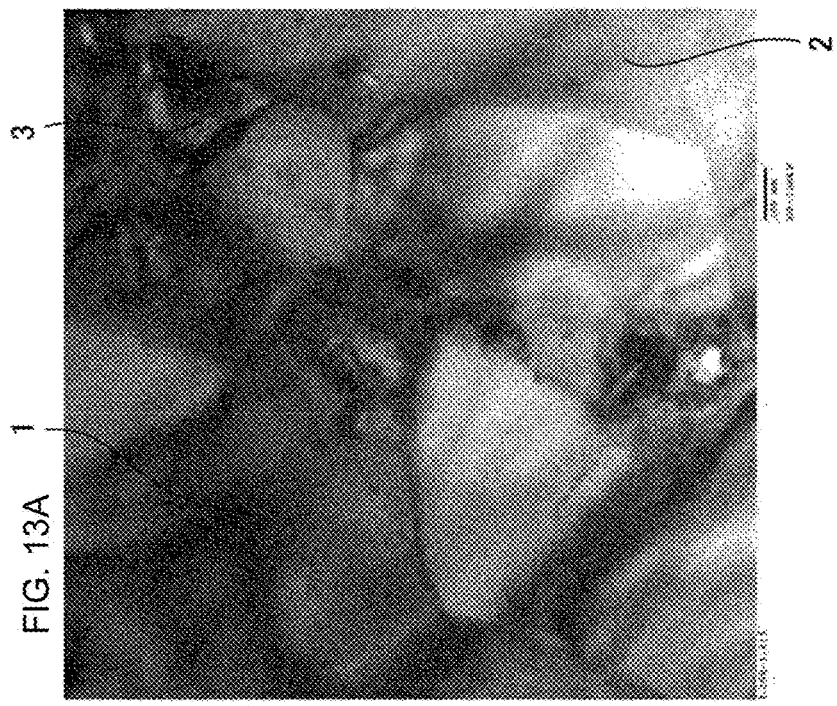
FIGS. 13A to 13E shows diagrams showing a TEM photograph of sample No. 10 being an Example, and electron beam diffraction patterns.
Figure 13B:
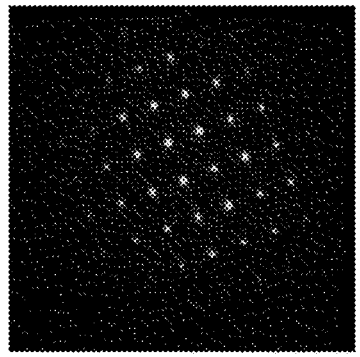
Figure 13C:
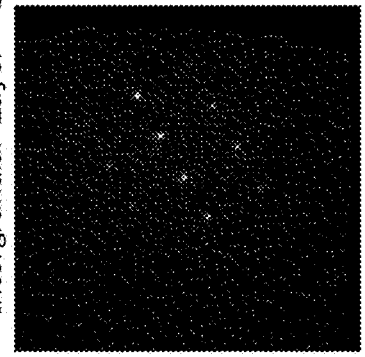
Figure 13D:
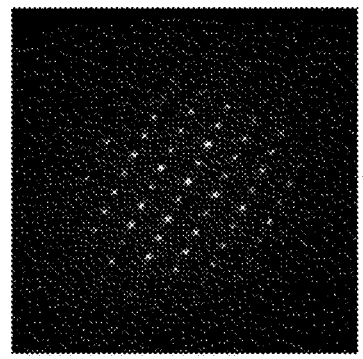
Figure 13E:
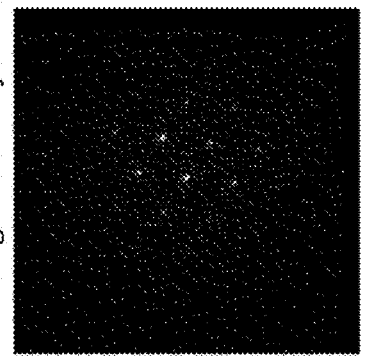

FIGS. 13A to 13E shows diagrams showing a TEM photograph of sample No. 10 being an Example, and electron beam diffraction patterns. In FIG. 13A is a TEM photograph, FIG. 13B is an electron beam diffraction pattern of position 1 (predetermined crystal grains) in FIG. 13A, FIG. 13C is an electron beam diffraction pattern of position 2 (intergranular layer) in FIG. 13A, FIG. 13D is an electron beam diffraction pattern of position 3 (interface of intergranular layer—a) in FIG. 13A, and FIG. 13E is an electron beam diffraction pattern of position 3 (interface of intergranular layer—b) in FIG. 13A.

Figure 14C:
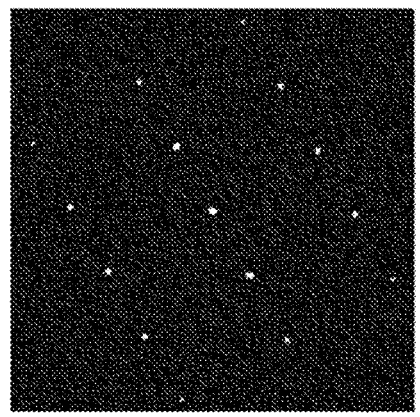
FIGS. 14A to 14C are diagrams showing identification results from electron diffraction patterns and simulations.
Figure 14B:
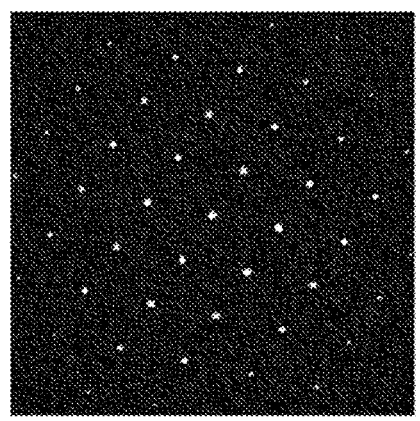
Figure 14A:
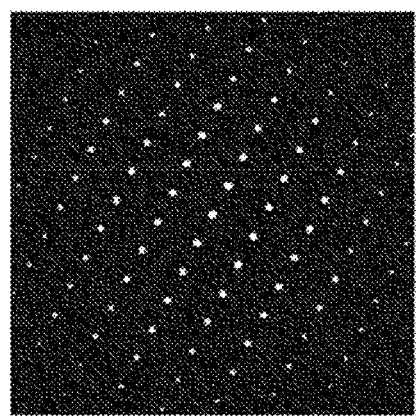

In addition, FIGS. 14A to 14C are diagrams showing identification results from electron diffraction patterns and simulations. Note that, in FIG. 14A shows an electron beam incident on $CoSb_3$ (space group: Im-3, a=9.08 Å) along the [011] direction, FIG. 14B shows an electron beam incident on $Yb_2O_3$ (space group: C2/m, a=13.73 Å, b=3.42 Å, c=8.45 Å) along the [101] direction, and FIG. 14C shows an electron beam incident on YbO (space group: Fm-3m, a=10.434 Å) along the direction. Compared with the electron beam diffraction pattern of FIG. 14A, the electron beam diffraction pattern of FIG. 14*b* had slightly different interplane gaps, and the electron beam diffraction pattern of FIG. 14C had mismatched inter-plane gaps.

Since the electron beam diffraction pattern of FIG. 13B and the electron beam diffraction pattern of FIG. 1A had a high level of match, it was found that the predetermined crystal grains forming the polycrystalline grains of the thermoelectric conversion material according to Examples corresponded to $CoSb_3$.

In addition, since the electron beam diffraction patterns of FIGS. 13C and 13D and the electron beam diffraction pattern of FIG. 14B had a high level of match, it was found that part of the intergranular layer between the neighboring polycrystalline grains in the thermoelectric conversion material according to Examples corresponded to $Yb_2O_3$. That is, it was found that the atomic ratio of O to Yb was 1.5 or a value close to this (for example, less than 1.5).

Plus, since the electron beam diffraction pattern of FIG. 13E and the electron beam diffraction pattern of FIG. 14C had a high level of match, it was found that part of the intergranular layer between the neighboring polycrystalline grains in the thermoelectric conversion material according to Examples corresponded to YbO. That is, if was found that the atomic ratio of O to Yb was 1.

From the content shown in FIGS. 13A to 13E, it was found that the thermoelectric conversion material according to Examples included: a large number of polycrystalline grains which included a skutterudite-type crystal structure containing Yb, Co, and Sb (that is, crystal grains); and an intergranular layer which was between the neighboring polycrystalline grains and included crystals in which an atomic ratio of O to Yb was more than 0.4 and less than 1.5.

The results shown in FIGS. 7A-E to 8l0, 11A to 11B, and 13A-E were the same for the samples according to other Examples (illustration omitted).

The electrical resistance of sample No. 29 being an Example was mapped. Its figure is the observation view (observation area of 20 μm×20 μm) shown in FIG. 2.

In addition, the electrical resistance of sample No. 7 being a Comparative Example was mapped. Its figure is the observation view (observation area of 20 μm×20 μm) shown in FIG. 3.

As shown in FIG. 2, it was confirmed that, since sample No. 29 being an Example included: a large number of polycrystalline grains which included a skutterudite-type crystal structure containing Yb, Co, and Sb; and an intergranular layer which was between the neighboring polycrystalline grains and included crystals in which an atomic ratio of O to Yb was more than 0.4 and less than 1.5, there were few portions with a high electrical resistance, and the electrical conductivity was high. On the other hand, as shown in FIG. 3, it was confirmed that sample No. 7 being a Comparative Example had scattered portions with a high electrical resistance, and the electrical conductivity was low.

Figure 15A:
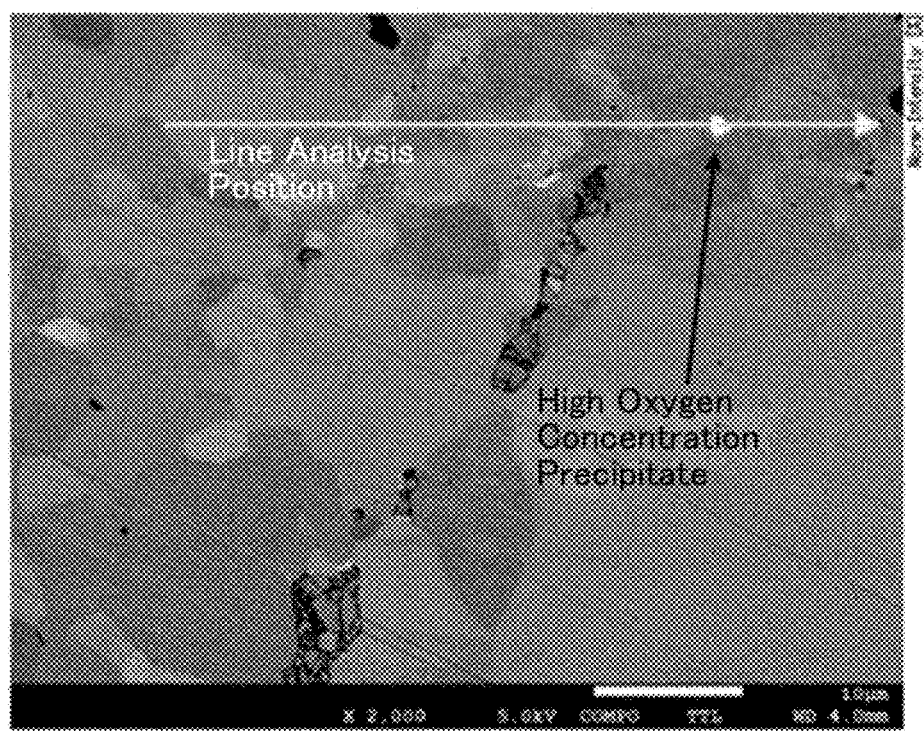
FIG. 15A is a SEM photograph of the high resistance portion of sample No. 7 being a Comparative Example. The scale bar at the lower right of FIG. 15A shows 10 μm.

FIG. 15A is a SEM photograph of the high resistance portion of sample No. 7 being a Comparative Example. Plus, FIG. 15B is a graph showing the results of high-sensitivity line analysis performed for the line analysis position shown in FIG. 15A. These are observation results for the purpose of highly sensitively analyzing the component composition of the high resistance phase shown in FIG. 3. As shown in FIG. 15B, it can be confirmed, from the comparison of the detected X-ray peak intensities, that the high resistance phase, that is, the high oxygen concentration precipitate (see FIG. 15A) has a component composition of $Yb_2O_3$.

Figure 16:
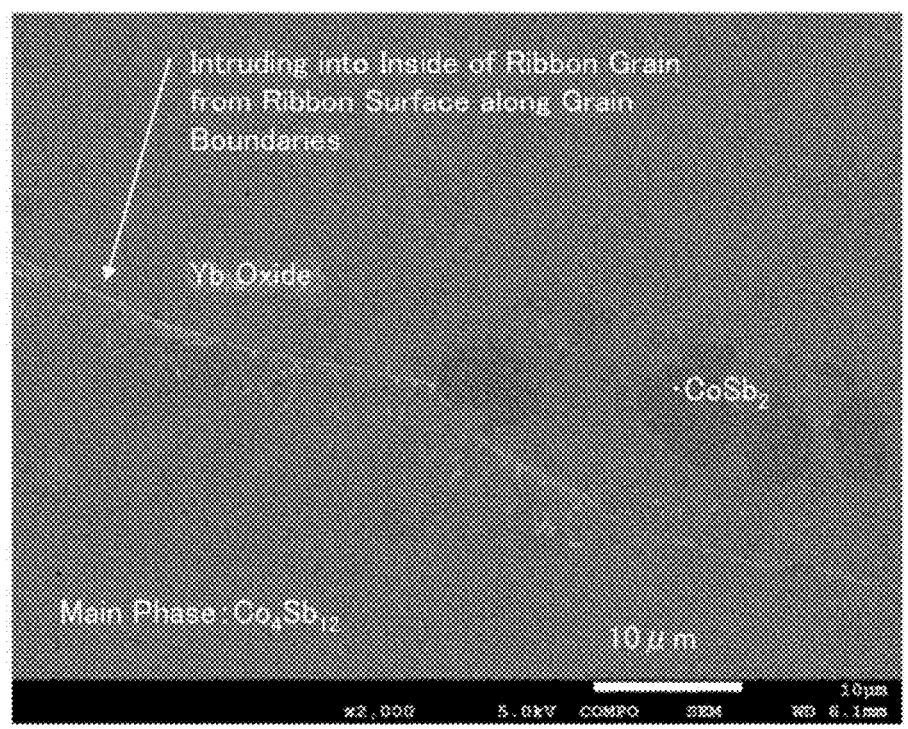
FIG. 16 is a cross-sectional SEM photograph in the vicinity of the boundaries of the polycrystalline grains of sample No. 7 being a Comparative Example. The scale bar at the lower right of FIG. 16 shows 10 μm.

FIG. 16 is a cross-sectional SEM photograph in the vicinity of the boundaries of the polycrystalline grains of sample No. 7 being a Comparative Example. FIG. 16 is an image captured to confirm a decrease in reliability of sample No. 7 being a Comparative Example. As shown in FIG. 16, it was confirmed that Yb was present as an oxide at the ribbon grain boundaries (grain boundaries formed in the preparation of the rapidly cooled ribbon) and gradually intruded into an inside of the crystal grains along the crystal grain boundaries (intruded into an inside of the ribbon grain from the ribbon surface along the grain boundaries). Further, as shown in FIG. 16, present in the vicinity of Yb (specifically, Yb oxide) was $CoSb_2$ (which is also the main phase) changed from the main phase $Co_4Sb_{12}$. The consideration is as follows. $CoSb_2$ is easier to oxidize than $Co_4Sb_{12}$. For this reason, the electrical conductivity changes not only due to mechanical damage caused by the stress generated from, for example, changes in crystal structure and movement of oxygen atoms but also due to the change over time in the amount of oxidation of $CoSb_2$ and the like as a result of serving as a highly active material compared to $Co_4Sb_{12}$. As a consequence, the reliability decreases.

Hereinabove, a detailed description has been provided for the thermoelectric conversion material, the thermoelectric conversion module, and the method for manufacturing a thermoelectric conversion material according to the present invention using an embodiment and Examples. However, the present invention is not limited to the embodiment and Examples described above, and includes various modifications.

REFERENCE SIGNS LIST 1 thermoelectric conversion material
11 polycrystalline grain
12 intergranular layer
13 crystal
2 opposite-phase thermoelectric conversion material
3 conductive material
3a first conductive material
3b second conductive material
4 element
5 lower substrate
6 upper substrate
7 first cord
8 second cord

The invention claimed is:
1. A first thermoelectric conversion material comprising:
(a) a large number of polycrystalline grains including a skutterudite-type crystal structure containing Yb, Co, and Sb; and
(b) an intergranular layer which is between the neighboring polycrystalline grains and includes crystals having an atomic ratio of O to Yb of more than 0.4 and less than 1.5.
2. The first thermoelectric conversion material according to claim 1, wherein the first thermoelectric conversion material has an anisotropy in at least one of a thermal conductivity and an electrical conductivity.
3. A thermoelectric conversion module comprising elements, wherein each of the elements comprises:
(a) the first thermoelectric conversion material according to claim 1;
(b) a second thermoelectric conversion material including a skutterudite-type crystal structure and having a phase opposite to the first thermoelectric conversion material; and
(c) a conductive material connecting the first thermoelectric conversion material and the second thermoelectric conversion material.
4. The first thermoelectric conversion material according to claim 1, wherein the intergranular layer has a thickness of 5 nm or more and 1 µm or less.
5. The first thermoelectric conversion material according to claim 4, wherein the first thermoelectric conversion material has an anisotropy in at least one of a thermal conductivity and an electrical conductivity.
6. The first thermoelectric conversion material according to claim 1, wherein the first thermoelectric conversion material has an oxygen concentration of 1,200 volume ppm or less.
7. The first thermoelectric conversion material according to claim 6, wherein the first thermoelectric conversion material has an anisotropy in at least one of a thermal conductivity and an electrical conductivity.
8. The first thermoelectric conversion material according to claim 6, wherein the intergranular layer has a thickness of 5 nm or more and 1 µm or less.
9. The first thermoelectric conversion material according to claim 8, wherein the first thermoelectric conversion material has an anisotropy in at least
one of a thermal conductivity and an electrical conductivity.
10. The first thermoelectric conversion material according to claim 1, wherein the skutterudite-type crystal structure containing Yb, Co, and Sb is represented by a composition formula $Yb_xCo_4Sb_{12}$ (where x is more than 0 and 0.3 or less).
11. The first thermoelectric conversion material according to claim 10, wherein the first thermoelectric conversion material has an anisotropy in at least one of a thermal conductivity and an electrical conductivity.
12. The first thermoelectric conversion material according to claim 10, wherein the intergranular layer has a thickness of 5 nm or more and 1 µm or less.
13. The first thermoelectric conversion material according to claim 12, wherein the first thermoelectric conversion material has an anisotropy in at least one of a thermal conductivity and an electrical conductivity.
14. The first thermoelectric conversion material according to claim 10, wherein the first thermoelectric conversion material has an oxygen concentration of 1,200 volume ppm or less.
15. The first thermoelectric conversion material according to claim 14, wherein the intergranular layer has a thickness of 5 nm or more and 1 µm or less.
16. The first thermoelectric conversion material according to claim 14, wherein the first thermoelectric conversion material has an anisotropy in at least one of a thermal conductivity and an electrical conductivity.
17. A method for manufacturing a thermoelectric conversion material comprising:
(a) weighing a raw material containing Yb, a raw material containing Co, and a raw material containing Sb;
(b) meltingly mixing the raw materials;
(c) preparing a ribbon by rapidly cooling and solidifying a melt of the raw materials by using a rapid liquid cooling solidifying method;
(d) obtaining polycrystalline grains by first heat treating, wherein the first heat treating comprises:
(i) heat treating the prepared ribbon in an inert atmosphere with an adjusted oxygen concentration; and

(ii) crushing;

(e) second heat treating, wherein the second heat treating comprises heat treating the polycrystalline grains, heat treated in the first heat treating, in a reducing atmosphere; and (f) manufacturing a thermoelectric conversion material by pressure sintering the polycrystalline grains, heat treated in the second heat treating, in an inert atmosphere.

18. The method for manufacturing a thermoelectric conversion material according to claim 17, wherein the polycrystalline grains, after being heat treated in a reducing atmosphere, are pressure sintered in the pressure sintering in an atmosphere of an argon gas with which the reducing atmosphere is replaced.

19. The method for manufacturing a thermoelectric conversion material according to claim 17, wherein the pressure sintering has a heat treatment temperature of 600° C. or higher and 800° C. or lower.

20. The method for manufacturing a thermoelectric conversion material according to claim 17, wherein the first heat treating has an oxygen concentration of 10 volume ppm or less.

\* \* \* \* \*